United States Patent
Belen et al.

(10) Patent No.: US 7,863,060 B2
(45) Date of Patent: Jan. 4, 2011

(54) METHOD OF DOUBLE PATTERNING AND ETCHING MAGNETIC TUNNEL JUNCTION STRUCTURES FOR SPIN-TRANSFER TORQUE MRAM DEVICES

(75) Inventors: Rodolfo Belen, San Jose, CA (US); Tom Zhong, Saratoga, CA (US); Witold Kula, Cupertino, CA (US); Chyu-Jiuh Torng, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 117 days.

(21) Appl. No.: 12/383,298

(22) Filed: Mar. 23, 2009

(65) Prior Publication Data

US 2010/0240151 A1      Sep. 23, 2010

(51) Int. Cl.
*H01L 21/00* (2006.01)
(52) U.S. Cl. .................. 438/3; 438/240; 438/671; 257/E21.665
(58) Field of Classification Search ............ 438/3, 438/240, 671, 717; 257/E21.665
See application file for complete search history.

(56) References Cited

U.S. PATENT DOCUMENTS

| | | | |
|---|---|---|---|
| 6,475,857 B1 | 11/2002 | Kim et al. | |
| 6,518,588 B1 * | 2/2003 | Parkin et al. ............... | 257/3 |
| 6,689,622 B1 * | 2/2004 | Drewes ..................... | 438/3 |
| 6,984,529 B2 | 1/2006 | Stojakovic et al. | |
| 7,067,866 B2 | 6/2006 | Shi | |
| 7,122,386 B1 | 10/2006 | Torng et al. | |
| 7,211,446 B2 | 5/2007 | Gaidis et al. | |
| 2005/0079647 A1 | 4/2005 | Abraham et al. | |
| 2007/0155027 A1 * | 7/2007 | Ditizio ..................... | 438/3 |
| 2007/0215911 A1 * | 9/2007 | Torng et al. ............... | 257/256 |
| 2008/0037179 A1 * | 2/2008 | Ito et al. ................... | 360/313 |
| 2009/0314740 A1 | 12/2009 | Ikemoto et al. | |

OTHER PUBLICATIONS

"Emission of spin waves by a magnetic multilayer traversed by a current," by L. Berger, Physical Review B, vol. 54, No. 13, Oct. 1, 1996, pp. 9353-9358.
"Current-driven excitation of magnetic multilayers," by J.C. Slonczewski, Journal of Magnetism and Magnetic Materials 159 (1996) L1-L7.

(Continued)

*Primary Examiner*—Michael Trinh
(74) *Attorney, Agent, or Firm*—Saile Ackerman LLC; Stephen B. Ackerman

(57) ABSTRACT

A method for forming a MTJ in a STT-MRAM is disclosed in which the easy-axis CD is determined independently of the hard-axis CD. One approach involves two photolithography steps each followed by two plasma etch steps to form a post in a hard mask which is transferred through a MTJ stack of layers. The hard mask has an upper Ta layer with a thickness of 300 to 400 Angstroms and a lower NiCr layer less than 50 Angstroms thick. The upper Ta layer is etched with a fluorocarbon etch while lower NiCr layer and underlying MTJ layers are etched with a $CH_3OH$. Preferably, a photoresist mask layer is removed by oxygen plasma between the fluorocarbon and $CH_3OH$ plasma etches. A lower hard mask layer made of NiCr or the like is inserted to prevent formation and buildup of Ta etch residues that can cause device shunting.

22 Claims, 15 Drawing Sheets

OTHER PUBLICATIONS

Co-Pending US Patent HMG07-026, U.S. Appl. No. 11/975,045, filed Oct. 17, 2007, "Method of Magnetic Tunneling Layer Processes for Spin-Transfer Torque MRAM," assigned to the same assignee as the present inventon.

PCT/US 10/00835 International Search Report, May 21, 2010, Magic Technologies, Inc.

* cited by examiner

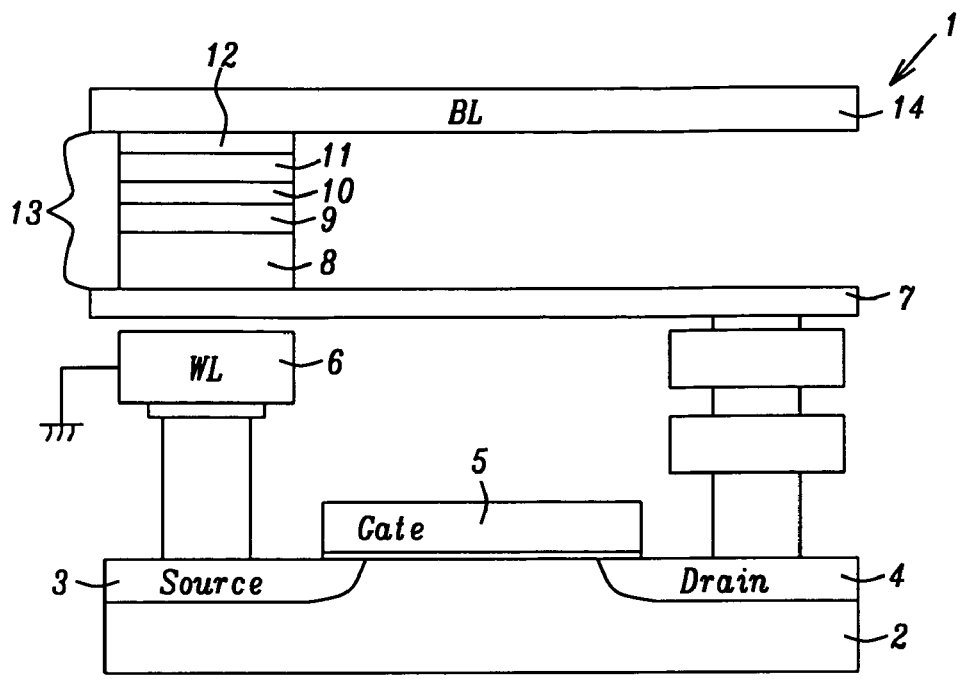
FIG. 1 — Prior Art
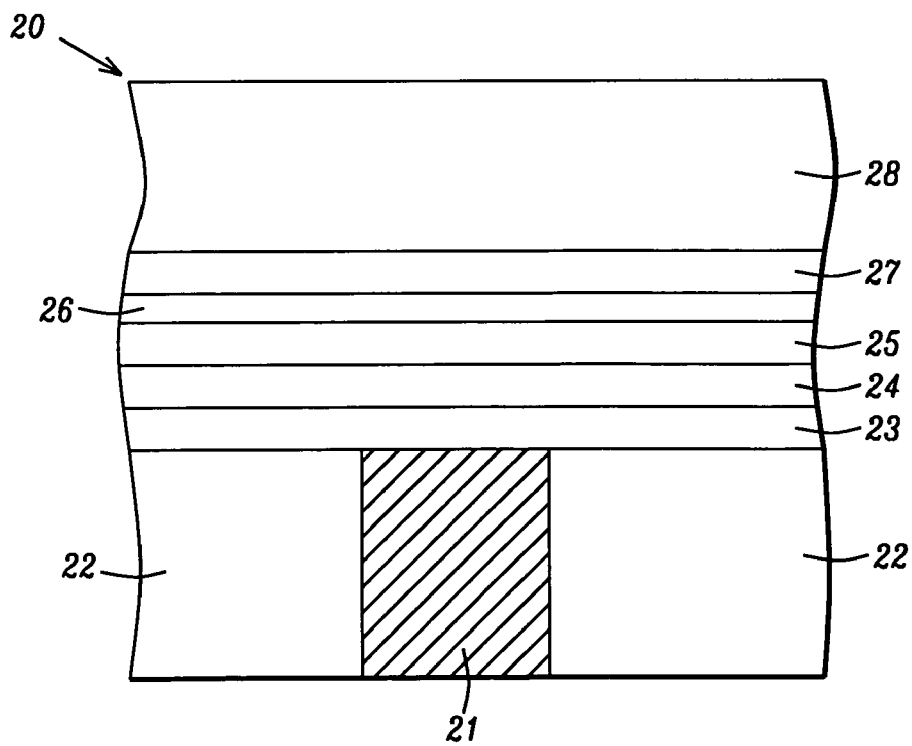
FIG. 2 — Prior Art

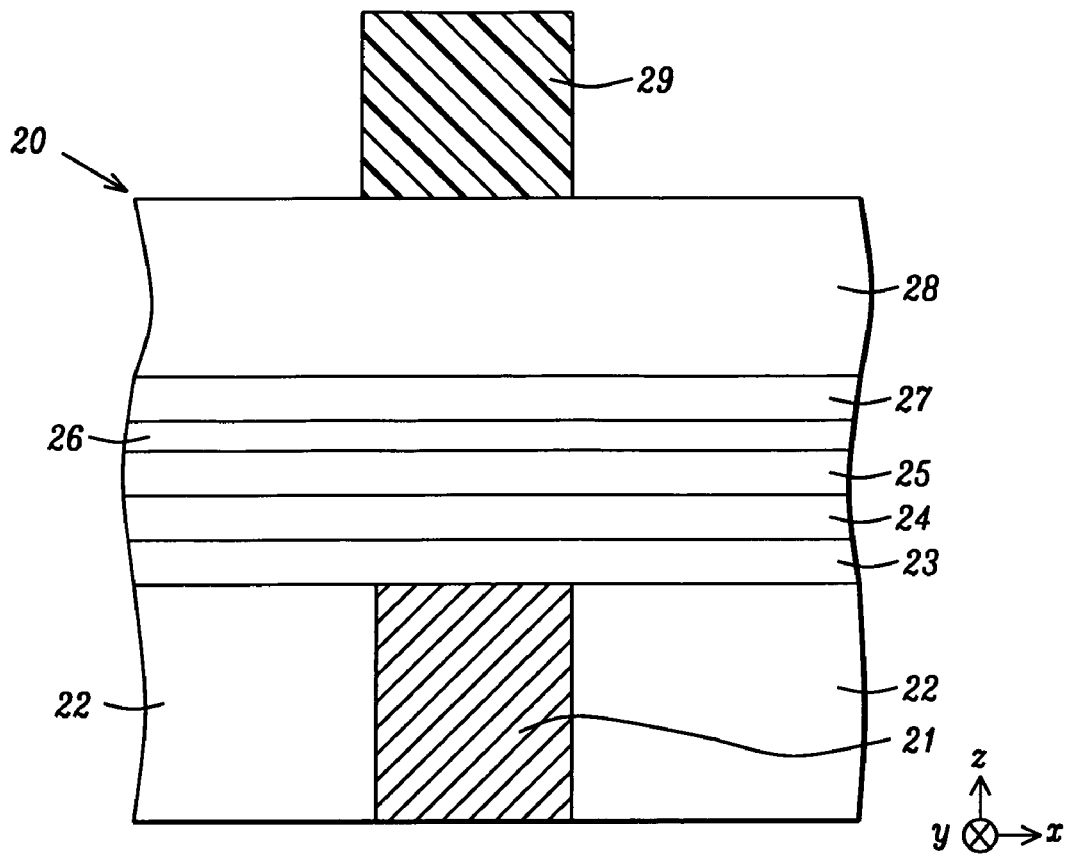
FIG. 3a – Prior Art
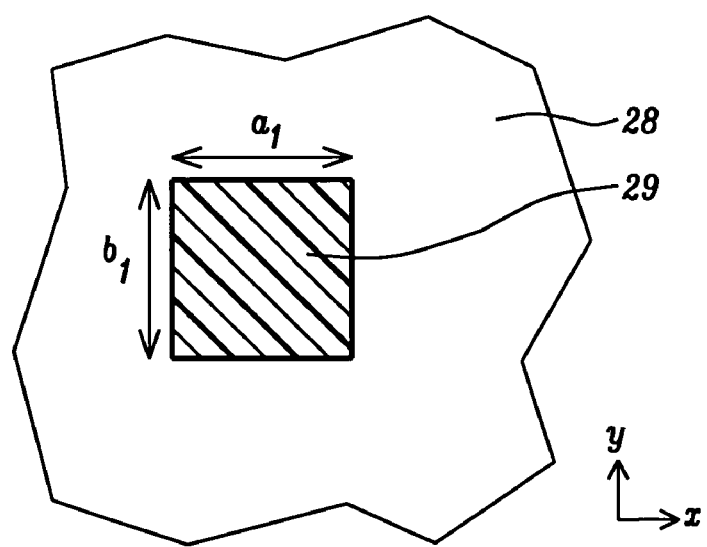
FIG. 3b – Prior Art

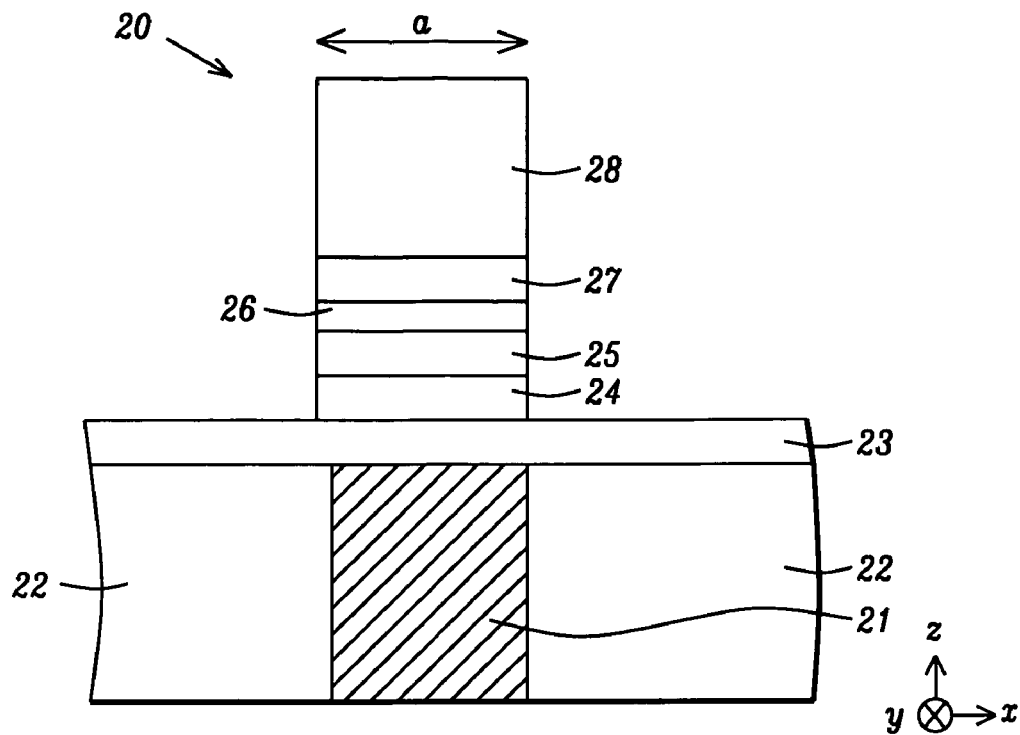
FIG. 4a – Prior Art
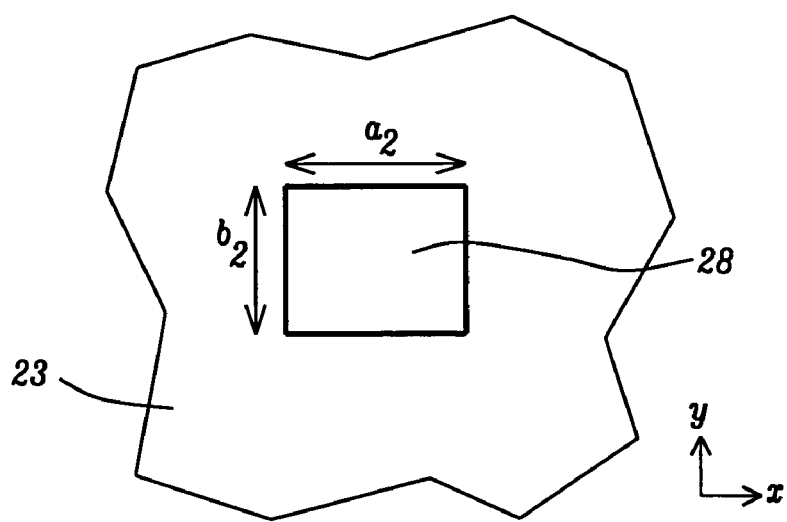
FIG. 4b – Prior Art

METHOD OF DOUBLE PATTERNING AND ETCHING MAGNETIC TUNNEL JUNCTION STRUCTURES FOR SPIN-TRANSFER TORQUE MRAM DEVICES

RELATED PATENT APPLICATION

This application is related to the following: Ser. No. 11/975,045 filing date Oct. 17, 2007; assigned to a common assignee and herein incorporated by reference in its entirety.

FIELD OF THE INVENTION

The invention relates to a process for double patterning and etching a magnetic tunneling junction (MTJ) for improved feature shape integrity and critical dimension (CD) control during the fabrication of spin-transfer torque MRAM (STT-MRAM) devices.

BACKGROUND OF THE INVENTION

Magnetoresistive Random Access Memory (MRAM), based on the integration of silicon based Complementary Silicon-Oxide Semiconductor (CMOS) with MTJ technology, is a technology that is highly competitive with existing semiconductor memories such as SRAM, DRAM, Flash, etc. MRAM is now a proven non-volatile memory technology with many advantages over other commercialized memory types in terms of writing/read speed, power consumption, lifetime, etc. However, conventional MRAM has a fundamental limitation of scalability. STT-MRAM not only possesses the major benefits of conventional MRAM but also has tremendous potential for scalability. Unlike conventional MRAM that requires a separate word line in addition to a BIT line to switch the magnetization direction of a free layer in a MTJ, STT-MRAM relies only on a current passing through the MTJ to rotate the free layer magnetization direction. In order for STT-MRAM to switch a bit, however, the current density passing through the MTJ device should be larger than a critical switching current density (Jc). Since current density is inversely proportional to device physical size given a fixed amount of current, the switching efficiency increases as the CD size of the MTJ decreases. Thus, CD is normally quite small for a STT-MRAM and is typically less than 100 nm in size.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer is preferably made of NiFe because of its reproducible and reliable switching characteristics as demonstrated by a low switching field (Hc) and switching field uniformity (σHc). Alternatively, a MTJ stack may have a top spin valve configuration in which a free layer is formed on a seed layer followed by sequentially forming a tunnel barrier layer, a pinned layer, AFM layer, and a capping layer.

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. In a read operation, when a sense current is passed from the top electrode to the bottom electrode in a direction perpendicular to the MTJ layers otherwise known as a current perpendicular to plane (CPP) configuration, a lower resistance is detected when the magnetization directions of the free and pinned layers are in a parallel state ("1" memory state) and a higher resistance is noted when they are in an anti-parallel state or "0" memory state.

During a write operation, information is written to the MRAM cell by changing the magnetic state in the free layer from a "1" to a "0" or from a "0" to a "1". In conventional MRAM, this process is accomplished by generating external magnetic fields as a result of applying bit line and word line currents in two crossing conductive lines, either above or below the MTJ element. Alternatively, in STT-MRAM, spin torque magnetization switching is used. Spin transfer (spin torque) magnetization switching has been described by J. Sloneczewski in "Current-driven excitation of magnetic multilayers", J. Magn. Materials V 159, L1-L7 (1996), and by L. Berger in "Emission of spin waves by a magnetic multilayer traversed by a current" in Phys. Rev. Lett. B, Vol. 52, p. 9353. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM (also known as Spin-RAM) and a conventional MRAM is only in the write operation mechanism. The read mechanism is the same.

Referring to FIG. 1, a memory cell 1 of a STT-MRAM includes a MTJ 13, word line (WL) 6, bit line (BL) 14, bottom electrode 7, and a CMOS transistor having a source 3, drain 4, and p-type semiconductor 2, for example, that provides current for switching the MTJ free layer 11. There is also a gate electrode 5. Additional layers in the MTJ 13 are an AFM layer 8, pinned layer 9, insulating barrier 10, and capping layer 12.

A critical current for spin transfer switching (Ic), which is defined as $[(Ic^{+}+I\ Ic^{-}I)/2]$, for the present 180 nm node submicron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin insulating barrier 10 such as AlOx, MgO, or the like. In order for spin-transfer magnetization switching to be viable in the 90 nm technology node and beyond, the critical current density (Jc) must be lower than $10^6$ A/cm$^2$ to be driven by a CMOS transistor that can typically deliver 100 μA per 100 nm gate width.

The fabrication process of a STT-MRAM is very challenging because of the small MTJ size where both easy-axis and hard axis dimensions must be controlled for optimum performance. In a CMOS process, the critical CD control for isolated and dense line features is in one dimension only and there are many well developed methodologies to control iso/dense CD for different applications. However, in MRAM processing, the critical CD involves a post (island) where a length along an easy-axis direction and a width along a hard-axis direction must be simultaneously controlled. Very little is understood in photolithography in terms of how to best control CD in a post pattern. Not only is dimensional control in an x-y plane crucial, but the thickness of the photoresist pattern in a z-direction plays an important factor. If the resist thickness is increased to provide extra process latitude for a subsequent etch step, then the aspect ratio (thickness/CD) may become too large and the post could collapse during image development. On the other hand, if the photoresist thickness is made thinner to allow smaller features to be printed with a larger process window without image collapse, then there may not be enough photoresist to serve as an adequate etch mask during a subsequent etch step where the photoresist pattern is transferred through the MTJ stack of layers. Methodologies have also been developed to control iso/dense line pattern collapse. However, the challenge is to apply existing photolithography techniques to MRAM MTJ fabrication. A process sequence is needed that enables two dimensional control of a MTJ post pattern having a CD of 100 nm or less while maintaining an adequate process latitude that does not suffer from pattern collapse.

The choice of a hard mask material to etch a MTJ film stack is also critical in MRAM processes. The ideal hard mask material should have a high etch rate selectivity so that a relatively thick MTJ stack can be etched without significant thickness loss in the hard mask. More importantly, the hard mask should not be prone to metal etch residue buildup. The formation and buildup of metal etch residue significantly affects shape integrity of two dimensional MTJ structures thereby degrading the performance of the STT-MRAM device.

In U.S. Pat. No. 6,984,529, a hard mask made of TiN and Ta is patterned and then oxidized before the pattern is transferred through the MTJ stack of layers.

U.S. Pat. No. 7,211,446 discloses a TiN or TaN hard mask. The hard mask is patterned to expose a portion of the free layer which is then converted to an electrically and magnetically inactive material.

U.S. Pat. No. 7,122,386 and U.S. Pat. No. 7,067,866 teach etching a MTJ stack of layers using a Ta hard mask.

SUMMARY OF THE INVENTION

One objective of the present invention is to provide a process for fabricating a MTJ element for a STT-MRAM device that enables two dimensional (CD) control in easy-axis and hard-axis directions while printing a post pattern.

A second objective of the present invention is to provide a process for fabricating a MTJ element in a STT-MRAM that enables better control of MTJ shape integrity.

According to the present invention, these objectives are achieved by a fabrication sequence that involves two photolithography steps and two etch steps to create a plurality of MTJs in a post pattern design on a substrate. A MTJ post pattern is formed by first depositing a stack of layers on substrate that may be a bottom electrode. In one aspect, the MTJ stack has a bottom spin valve configuration in which a seed layer, AFM layer, synthetic anti-ferromagnetic (SyAF) pinned layer, tunnel barrier layer, free layer, hard mask spacer, and a composite hard mask made of a lower NiCr layer and an upper Ta layer are sequentially formed on the substrate. All of the layers in the MTJ stack may be formed by sputtering or ion beam deposition (IBD). Thereafter, the MTJ stack of layers may be annealed in an easy-axis direction, hard-axis direction, or along both easy-axis and hard-axis directions. Next, a fabrication sequence that comprises two photolithography steps and two etch steps to define CDs in a hard axis direction and easy axis direction is followed.

In one embodiment, a first patterning step is employed to coat a first photoresist layer on the hard mask and print a plurality of parallel lines in the first photoresist layer to expose certain portions of the top surface of the upper hard mask layer. For example, the plurality of parallel lines may be oriented in an x-axis direction that will become the easy-axis of the MTJ element. A first etch step with $CF_4$ plasma or the like is then employed to transfer the photoresist pattern through the exposed portions of the upper hard mask layer and stop on the lower hard mask layer. The first photoresist is removed with an oxygen plasma step. Next, the parallel line pattern in the upper hard mask layer is transferred through the lower hard mask layer with a $CH_3OH$ plasma etch or the like and stops on the hard mask spacer layer. Thereafter, a second photoresist layer is formed on the hard mask spacer layer and hard mask line pattern. A second photoresist patterning step is employed to print a plurality of lines in a hard axis direction, for example, that are preferably perpendicular to the plurality of hard mask lines aligned in an easy axis direction. Optionally, the second photoresist patterning step results in a plurality of parallel photoresist lines that intersect the hard mask lines at an angle unequal to 90 degrees. Then a second etch step transfers the second photoresist pattern through the upper hard mask layer and stops on the lower hard mask layer. A second oxygen plasma etch is performed to remove the second photoresist layer. A second $CH_3OH$ plasma etch is used to remove exposed portions of the lower hard mask layer to form a post pattern that is essentially islands of hard mask arranged in rows and columns on the hard mask spacer layer. The second $CH_3OH$ etch is continued to remove exposed regions of the hard mask spacer layer and underlying MTJ layers and stops on the bottom electrode. As a result, a plurality of MTJ pillars or posts are formed on the bottom electrode. The lower hard mask layer is advantageously employed to prevent metal formation and buildup on the upper hard mask layer during the fluorocarbon etch processes.

According to a second embodiment, the first photoresist pattern is transferred through the upper hard mask layer with a first fluorocarbon etch, and the first $CH_3OH$ etch is used to transfer the first parallel line pattern through the entire stack of MTJ layers. Alternatively, the first $CH_3OH$ etch step transfers the first parallel line pattern through the lower hard mask layer, hard mask spacer layer, and at least a portion of the free layer, and stops on or slightly above the tunnel barrier layer. From a top view, a plurality of hard mask lines is formed. If the end point is above the tunnel barrier layer, then an oxidation process is performed to oxidize the remaining free layer above the tunnel barrier for device insulation purposes. A separate patterning and etching sequence may be employed to pattern the bottom electrode and thereby electrically isolate the MTJ element from adjacent MTJ elements. Thereafter, a layer of insulating material such as $SiO_2$ or $Al_2O_3$ is deposited on the etched pattern to a level above the hard mask lines. A CMP step follows in order to planarize the insulation layer at a level equal to or slightly above that of the hard mask lines.

A second photoresist is coated on the planarized insulation layer and a second photoresist patterning step is performed to form a plurality of parallel lines that intersect the hard mark lines from a top view either at a 90° angle or at an angle <90°. A second etch sequence comprised of a second fluorocarbon etch and second $CH_3OH$ etch is used to etch the composite hard mask layer and continue through the MTJ stack and stops on the bottom electrode or at an end point on or slightly above the tunnel barrier layer. A plurality of posts (islands) which are MTJ elements are thereby formed. Since the insulation layer is planarized before the second photoresist patterning step, the hard mask thickness is not constrained by the second patterning process.

BRIEF DESCRIPTION OF THE DRAWINGS

FIG. 1 is a cross-sectional view showing a conventional memory cell in a STT-MRAM device.

FIG. 2 is cross-sectional view of a MTJ stack of layers formed on a bottom electrode prior to patterning a MTJ element according to a conventional fabrication method.

FIG. 3a and FIG. 3b are cross-sectional and top-down views, respectively, of a photoresist post pattern formed by a conventional method on the MTJ stack in FIG. 2.

FIG. 4a and FIG. 4b are cross-sectional and top-down views, respectively, of the post pattern in FIGS. 3a, 3b that has been transferred through the MTJ stack of layers according to a conventional fabrication method.

DETAILED DESCRIPTION OF THE INVENTION

Figure 5:
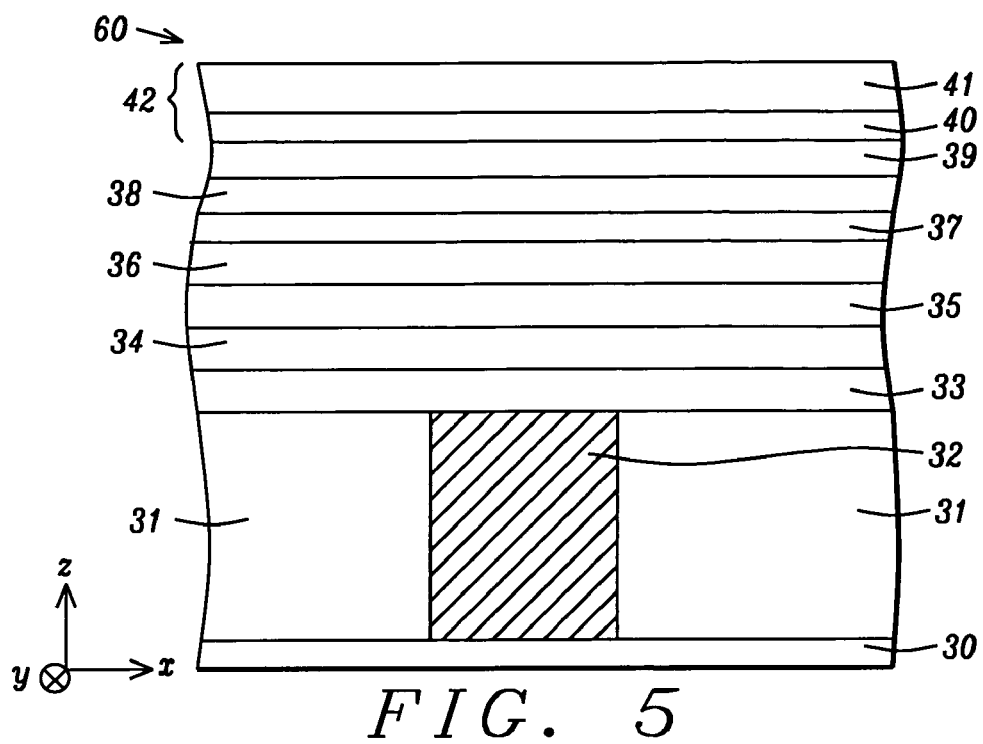
FIG. 5 is a cross-sectional view of a MTJ stack of layers formed according to one embodiment of the present invention.

The present invention is a method of fabricating a MTJ element in a STT-MRAM device that enables two dimensional (CD) control in easy-axis and hard-axis directions while providing for better feature shape integrity. Although the exemplary embodiment refers to a STT-MRAM, the present invention also encompasses other devices comprised of MTJ elements such as MRAM and GMR sensors in read/write heads.

It should be understood that the inventors have previously practiced a MTJ fabrication method outlined in FIGS. 2-4b involving a bottom electrode 23 and a MTJ stack of layers 24-28 sequentially formed on a substrate comprised of a metal stud 21 and a surrounding insulation layer 22. Referring to FIG. 2, after the bottom electrode 23 is deposited on the substrate, a MTJ stack of layers in partially formed MTJ structure 20 is laid down on the bottom electrode by depositing an AFM layer 24, pinned layer 25, tunnel barrier 26, free layer 27, and a hard mask 28. A seed layer (not shown) may also be employed between the bottom electrode 23 and AFM layer 24.

In FIG. 3a, a photoresist layer 29 is patterned on the hard mask 28. The photoresist pattern in FIG. 3a is depicted from a top-down view in FIG. 3b. Note that dimensions $a_1$ and $b_1$ are simultaneously formed in the patterning process. As mentioned previously, two dimensional CD control is difficult to achieve by a single patterning scheme when one or both $a_1$ and $b_1$ dimensions are approximately 100 nm or less. Typically, a single patterning scheme for printing sub-100 nm features with two critical dimensions leads to an unacceptable amount of rework and is not useful for manufacturing STT-MRAM structures or the like.

Referring to FIG. 4a, the photoresist pattern in FIG. 3a is etch transferred through the hard mask 28. Then the photoresist layer is removed and the resulting pattern in the hard mask 28 is etch transferred through the remaining MTJ layers 24-27. Bottom electrode 23 may be patterned by continuing the MTJ etch step (not shown) or may be patterned in a separate step before the MTJ stack of layers 24-28 is laid down.

In FIG. 4b, a top view of the resulting MTJ element shows a top surface of hard mask 28 having length and width dimensions $a_2$ and $b_2$, respectively. Dimension $a_2$ may be different than $a_1$, and $b_2$ may be different than $b_1$ because of etch erosion along the sides of the hard mask 28, for example. In STT-MRAM and other applications where one or both of $a_2$ and $b_2$ are less than or equal to about 100 nm, the imperfections in the photoresist patterning process are carried through the etch step. Therefore, the lack of CD control in $a_1$ and $b_1$ is transferred to $a_2$ and $b_2$ and thereby prevents the prior art method from being used to fabricate high performance MTJs necessary for STT-MRAM devices. Furthermore, the previously described etch process has a tendency to generate metal residue on the hard mask that builds up between adjacent MTJ elements and can lead to device shunting as described in more detail in a later section referring to FIG. 17.

The inventors have discovered an improved method of forming a MTJ element in a STT-MRAM structure and for other sub-100 nm devices that is a modification of an earlier scheme disclosed in MagIC patent application Ser. No. 11/975,045. Various embodiments of an improved MTJ fabrication scheme will now be described that not only afford better CD control but essentially eliminate metal etch residues during the hard mask etch thereby leading to improved device integrity and higher performance.

Referring to FIG. 5, a partially completed STT-MRAM structure 60 is shown that includes a substrate 30 which may be a CMOS substructure used in the art that typically contains devices such as transistors and diodes. A first insulation layer 31 comprised of $Al_2O_3$, silicon oxide, or the like is disposed on the substrate 30. There is a metal contact 32 to the CMOS substructure 31 formed within and coplanar with the first insulation layer 31. The metal contact 32 may be made of copper, for example. It should be understood that there is a plurality of metal contacts 32 formed within the first insulation layer 31, and there is a plurality of STT-MRAMs 60 formed on the substrate 30. However, only one metal contact and one STT-MRAM are depicted to simplify the drawing. There is also a plurality of bit lines and word lines (not shown) formed in a cross-point architecture as appreciated by those skilled in the art. For example, a MTJ element is formed between a bottom electrode layer and a bit line at each location where a bit line crosses over a word line.

A bottom electrode layer 33 is formed on the first insulation layer 31 and contacts the metal contact 32. Typically, the bottom electrode layer 33 is interconnected to an underlying transistor (not shown) in substrate 30. The bottom electrode layer 33 may be a composite layer comprised of a lower seed layer, middle conductive layer, and upper capping layer (not shown). Moreover, the bottom electrode layer 33 may be a sectioned line, for example, that has a rectangular shape in the x, y plane and a thickness in the z direction. Alternatively, the bottom electrode layer 33 may be a bit line that is aligned orthogonally to an underlying word line (not shown) and to a subsequently formed second word line above the MTJ. In one embodiment where the bottom conductor layer has a seed layer/conductive layer/capping layer configuration, the seed layer may be comprised of NiCr, Ta, or TaN. The conductive layer may be made of Ru, Rh, Ir or other metals such as Au, Cu, or α-Ta. The capping layer may be an amorphous Ta layer, for example, that serves to promote uniform and dense growth in subsequently formed MTJ layers.

An MTJ stack of layers is now formed on the bottom electrode layer 33. It should be understood that the MTJ stack may be formed in the same process tool as the bottom conductor layer. For instance, the bottom electrode layer 33 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 33 and overlying MTJ layers may be formed after a single pump down of the sputter system to enhance throughput.

In a preferred embodiment, the MTJ stack of layers is fabricated on the bottom electrode layer 33 by sequentially forming a seed layer 34, AFM layer 35, SyAF pinned layer 36, tunnel barrier layer 37, free layer 38, hard mask spacer layer 39, and a composite hard mask layer 42 having a lower layer 40 and an upper layer 41. The seed layer 34 has a thickness of about 40 to 60 Angstroms and may be made of NiCr, NiFe, NiFeCr, or other suitable materials used in the art. When the seed layer 34 is grown on an amorphous Ta capping layer in the bottom conductor layer 33, a smooth and dense (111) seed layer structure results that promotes smooth and densely packed growth in subsequently formed MTJ layers.

The AFM layer 35 may be made of an alloy such as MnPt, IrMn, NiMn, OsMn, RuMn, RhMn, PdMn, RuRhMn, or MnPtPd. In the exemplary embodiment, the AFM layer is magnetically aligned in the y-axis direction. An external magnetic field may be applied during the deposition of an MTJ layer such as an AFM layer or a ferromagnetic (FM) layer to influence a magnetization along a certain axis.

The pinned layer 36 preferably has a SyAF structure with an AP2/coupling layer/AP1 configuration (not shown). Use of a SyAF pinned layer in the MTJ structure not only improves thermal stability but also reduces the interlayer coupling field (offset field) applied to the free layer. The AP2 layer is formed on the AFM layer 35 and is preferably comprised of CoFe with a composition of about 25 atomic % Fe and with a thickness of about 20 to 30 Angstroms. The magnetic moment of the AP2 layer is pinned in a direction anti-parallel to the magnetic moment of the AP1 layer. A slight difference in thickness between the AP2 and AP1 layers produces a small net magnetic moment for the SyAF pinned layer 36 along the y-axis. Exchange coupling between the AP2 layer and the AP1 layer is facilitated by a coupling layer that is preferably comprised of Ru with a thickness of about 7.5 Angstroms although Rh or Ir may be used instead of Ru. The AP1 layer on the Ru coupling layer may be comprised of CoFe or amorphous CoFeB and has a thickness of about 15 to 25 Angstroms.

Above the SyAF pinned layer 36 is formed a thin tunnel barrier layer 37 that is preferably MgO. The MgO tunnel barrier layer may be formed by depositing a first Mg layer about 8 Angstroms thick followed by an in-situ radical oxidation (ROX) or natural oxidation (NOX) in an oxidation chamber, and then deposition of a second Mg layer about 2 to 6 Angstroms thick. Optionally, the tunnel barrier layer 37 may be comprised of other materials such as AlOx or AlTiOx.

It has been shown that a MTJ made with a crystalline MgO barrier layer and a CoFeB free layer is capable of delivering a very high dR/R as described in the prior art references. High dR/R is a result of coherent tunneling in which electron symmetry of the ferromagnetic electrode is preserved in tunneling through the crystalline MgO barrier. An MgO tunnel barrier is also preferred for optimizing MTJ performance with respect to Jc, RA, and Rp_cov.

The free layer 38 formed on the tunnel barrier layer 37 may be comprised of the same amorphous CoFeB composition as in the AP1 portion of the pinned layer 36. The free layer 38 has a thickness between 20 and 30 Angstroms and is magnetically aligned along the y-axis (pinned layer direction). The present invention also anticipates that one or more other materials such as CoFe and NiFe may be employed in the free layer 38 to form a CoFe/NiFe composite or a composite with CoFeB.

The hard mask spacer layer 39 contacts a top surface of the free layer and may be comprised of Cu or MnPt with a thickness of 200 to 800 Angstroms. The hard mask spacer layer 39 serves as an etch stop during MTJ pattern transfer through lower hard mask layer 40. Preferably, hard mask spacer layer 39 has a $CH_3OH$ etch selectivity of at least 3 to 1 relative to the lower hard mask layer 40 in order to provide a wider etch margin during a subsequent etch step that transfers the hard mask pattern through the MTJ stack of layers.

A key feature of the present invention is the composition of the composite hard mask 42. The upper hard mask layer 41 may be made of Ta and preferably has a thickness less than 500 Angstroms to allow an adequate process window in a subsequent photolithography step that determines the eventual MTJ shape and size from a top-down perspective. In other words, if upper hard mask layer 41 is greater than about 500 Angstroms thick, then a larger photoresist thickness is required in order to etch transfer the MTJ pattern in the photoresist layer through the upper hard mask layer without consuming all of the photoresist which serves as an etch mask as described in a later section.

The thickness of the upper hard mask layer 41 is also determined by process requirements for hard mask etching and for subsequent chemical mechanical polishing (CMP) steps where a Ta layer, for example, functions as a CMP stop during processing that planarizes an insulation layer (not shown) formed adjacent to the upper hard mask layer. Also, a thick Ta layer 41 is avoided to prevent longer etch times which causes severe line edge roughness and adversely affects the shape integrity of the resulting MTJ and STT-MRAM performance. In one experiment, a 300 Angstrom thick Ta upper hard mask layer 41 was an optimum thickness while a 500 Angstrom thick Ta film gave unacceptable line edge roughness following a sequence of fluorocarbon and $CH_3OH$ etches. A minimum Ta upper hard mask thickness of about 300 Angstroms is required to provide an adequate mask for transferring a pattern formed in a Ta layer 41 through underlying layers in the MTJ stack.

The lower hard mask layer 40 which contacts the hard mask spacer layer 39 may be comprised of NiCr with a thickness less than about 50 Angstroms and is relied upon to prevent metal residue formation and buildup on the upper hard mask layer 41 in $CF_4$ plasma which is used to etch the upper hard mask layer during pattern transfer of parallel lines in a photoresist layer through the upper hard mask layer. In an alternative embodiment, NiCr may be replaced by a different material such as Ni, Co, Fe or alloys thereof doped with materials such as Cr or Mo that would retard the etch rate in $CH_3OH$ plasma. Preferably, the relative etch rate of the lower hard mask layer 40 to upper hard mask layer 41 is at least 5:1 in $CH_3OH$ plasma and the etch selectivity of the upper hard mask layer to lower hard mask layer is about 30:1 in fluorocarbon plasma.

The present invention also encompasses an annealing step after all of the MTJ layers have been deposited. For example, in the exemplary embodiment, the MTJ stack of layers may be annealed in a vacuum by applying a magnetic field of 10K Oe in magnitude along the easy axis for 1 to 5 hours at a temperature of about 250° C. to 300° C. An anneal process may also be performed along a hard-axis direction.

Figure 6A:
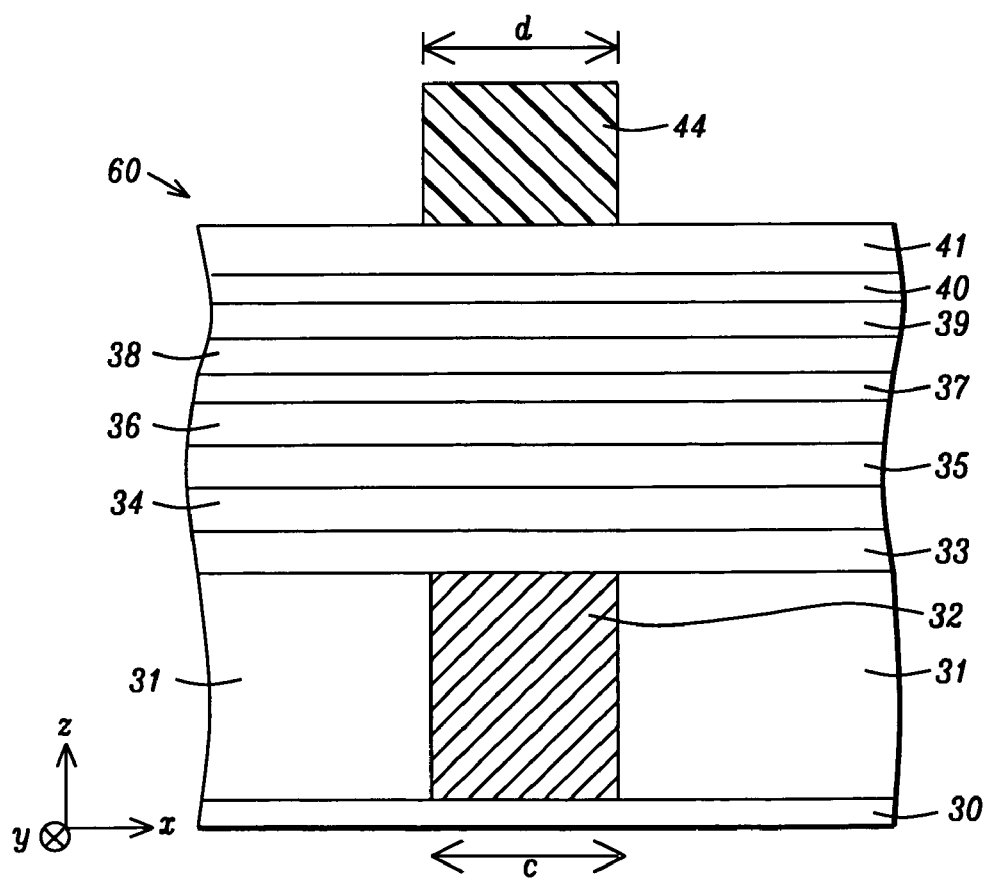
FIG. 6a and FIG. 6b are cross-sectional and top views, respectively, of a first photoresist pattern formed on the MTJ stack of layers in FIG. 5.
Figure 6B:
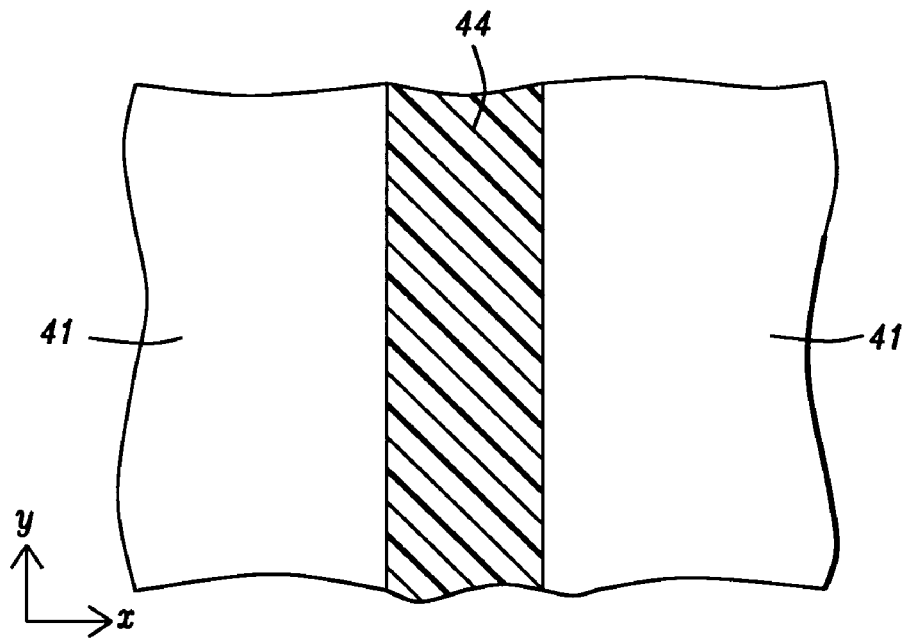

Referring to FIGS. 6*a*-6*b*, after all of the MTJ layers have been deposited and annealing is completed, the next step in fabricating a MTJ element is coating and patterning a first photoresist layer 44 to generate a line having a width d in an x-axis direction on the upper hard mask layer 41. As mentioned previously, it should be understood that a plurality of parallel photoresist lines 44 are formed and each has a width d but only one is depicted in the exemplary embodiment to simplify the drawing. The width d corresponds to the desired critical dimension (CD) of the MTJ element in the x-axis direction which may be either the hard-axis or easy-axis direction. A key feature of the fabrication process is to generate a CD along a hard-axis direction independent of generating a CD along an easy axis direction and thereby provide better control of the area (from a top-view) of the MTJ element. As a result, the plurality of MTJ elements formed by the fabrication method described herein will have a more uniform shape and more a uniform performance than achieved by a conventional method as shown in FIGS. 2-4*b*. The method of the present invention is especially advantageous when at least one of the hard-axis CD and easy-axis CD is about 100 nm or less. Preferably, the short axis (hard axis) CD dimension is from about 50 nm to 70 nm and the long axis (i.e. easy axis) CD dimension is from about 50 nm to 400 nm.

Figure 7A:
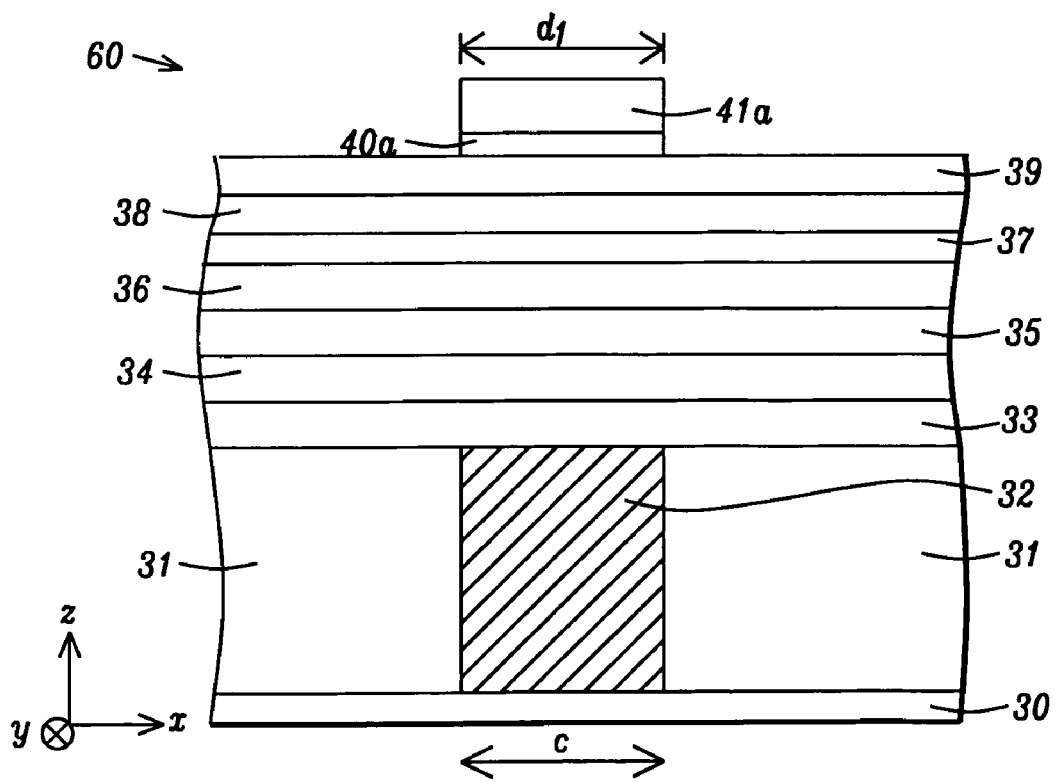
FIG. 7a and FIG. 7b are cross-sectional and top-down views, respectively, after an etch transfer of the first photoresist pattern through the composite hard mask and removal of the first photoresist layer.
Figure 7B:
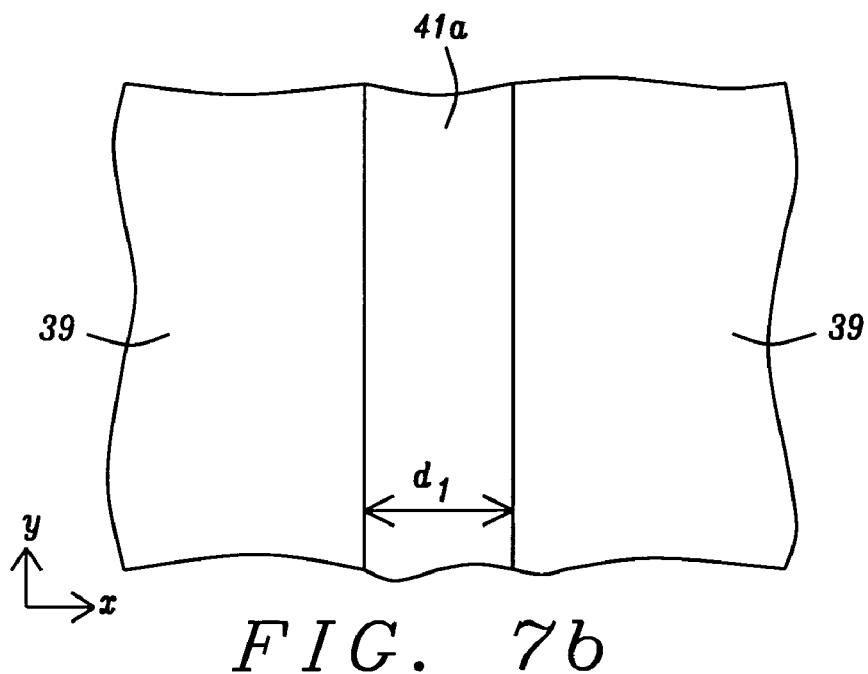

Referring to FIGS. 7*a*, 7*b*, the first photoresist layer 44 is employed as an etch mask during a first etch step such as a Reactive Ion Etch (RIE) process that removes regions of the upper hard mask layer 41 which are not protected by the etch mask. The RIE process may be comprised of $CF_4$ or another fluorocarbon gas and stops on the lower hard mask layer 40 because of the high etch selectivity mentioned previously. In other words, the exposed regions of the upper hard mask layer 41 etch at a substantially higher rate than the lower hard mask layer 40 during the fluorocarbon etch. As a result, the parallel line pattern in photoresist layer 44 is transferred into the upper hard mask layer and generates a plurality of parallel lines 41*a*. Those skilled in the art will appreciate that there may be some linewidth change from d in first photoresist layer 44 to $d_1$ in hard mask lines 41*a* since the etching process does not necessarily yield a perfect transfer due to such factors as photoresist erosion during the etch process. Any remaining photoresist layer 44 is then stripped by an oxygen plasma method known to those skilled in the art.

Thereafter, a second etch process is performed with a $CH_3OH$ plasma or the like to transfer the parallel line 41*a* through the lower hard mask layer 40. The second etch has an end point when reaching hard mask spacer layer 39 which serves as a stop layer by having an etch rate in $CH_3OH$ that is substantially less than that of NiCr, for example, in the lower hard mask layer 40. As a result, a plurality of lines with a dimension $d_1$ in the x-axis direction are formed having an upper layer 41*a* and a lower layer 40*a*. In one embodiment, hard mask spacer 39 and the plurality of lines formed after the second etch step are treated with an oxygen plasma in order to promote good adhesion of a second photoresist coating in a subsequent fabrication step. The $O_2$ plasma step is recommended because of our observation that post-NiCr etch surfaces do not wet well with photoresist unless the $O_2$ plasma surface treatment is employed.

Figure 8A:
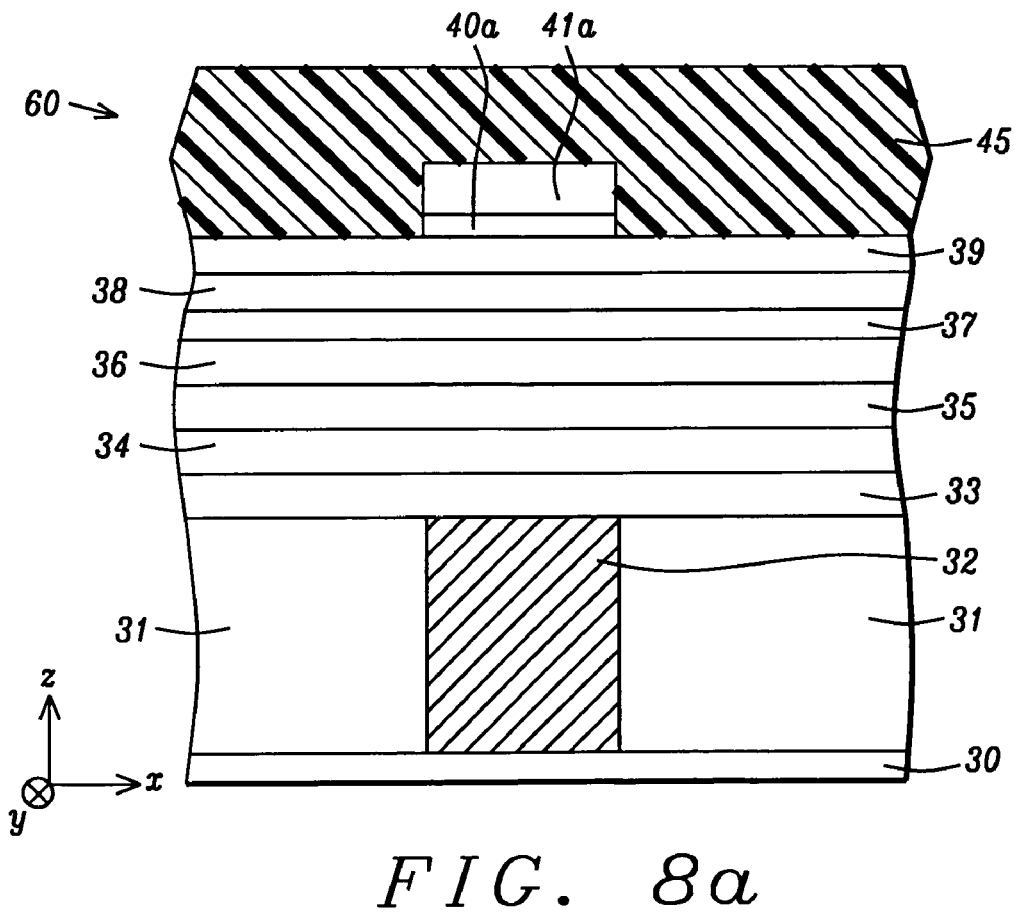
FIGS. 8a, 8b are cross-sectional and top-down views, respectively, of a second photoresist pattern formed on the partially etched MTJ stack of layers in FIGS. 7a, 7b.
Figure 8B:
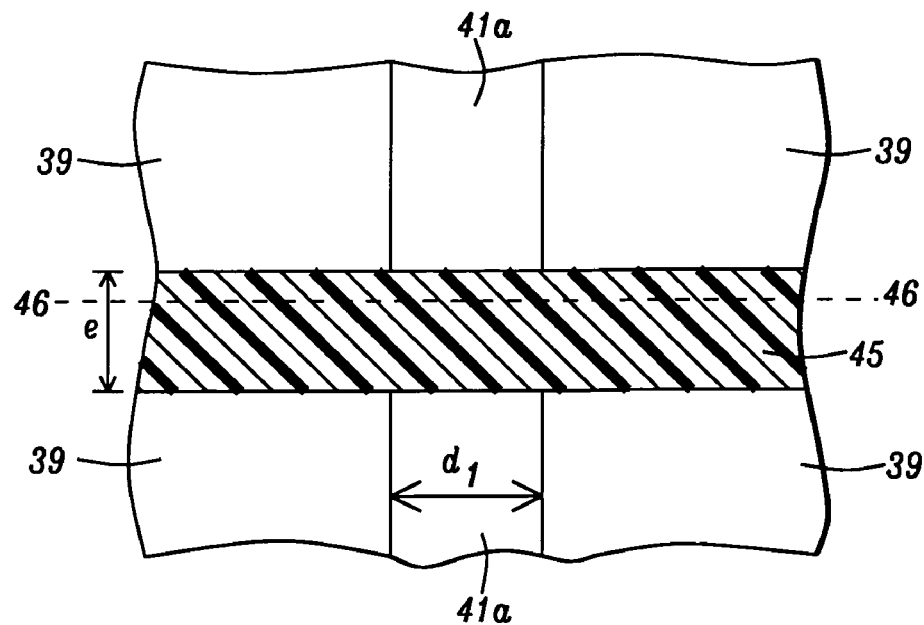

Referring to FIGS. 8*a*, 8*b*, a second photoresist layer 45 is coated on the partially formed STT-MRAM 60 after the second etch step and oxygen plasma treatment. A second photolithography process is employed to form a second parallel line pattern that intersects the plurality of parallel hard mask lines 41*a*. Only one second photoresist line 45 is depicted in the second parallel line pattern in order to simplify the drawings. In one aspect, the second parallel line pattern is formed perpendicular to the plurality of parallel hard mask lines 41*a*. Optionally, the second parallel line pattern comprised of second photoresist line 45 may intersect the hard mask lines 41*a* at an angle between 0 and 90°. In the exemplary embodiment, the second photoresist line 45 has a width e in a y-axis direction that corresponds to the CD in the easy-axis direction. Alternatively, when the x-axis represents the easy-axis direction, then the y-axis corresponds to the hard-axis direction. In either case, it is critical that the dimensions d and e be generated in separate photolithography steps to provide better control of the area (e×d) and ($e_1 \times d_1$ in FIG. 9b). Although the exemplary embodiment depicts the relative sizes of d and e to be about equal, the present invention also encompasses an embodiment wherein the easy-axis dimension may be up to 2 or 3 times greater than the hard-axis dimension.

Figure 9A:
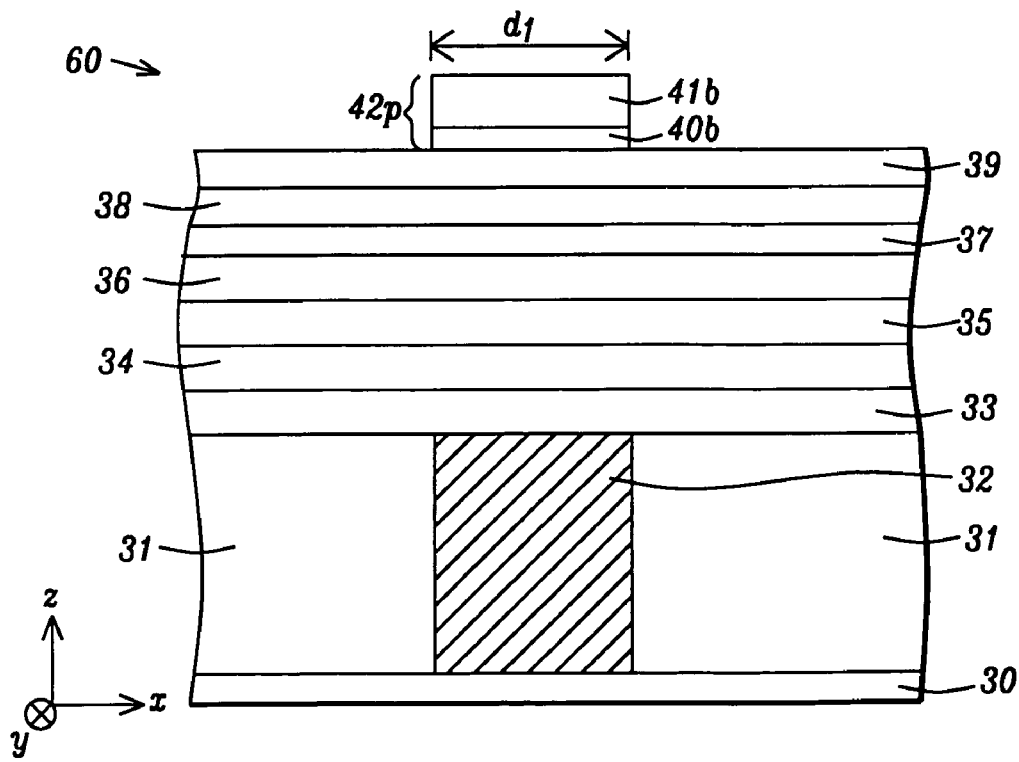
FIG. 9a and FIG. 9b are cross-sectional and top-down views, respectively, after a second etch transfer of the second photoresist pattern through the composite hard mask to form a post (island) on the hard mask spacer layer, and removal of the second photoresist layer.
Figure 9B:
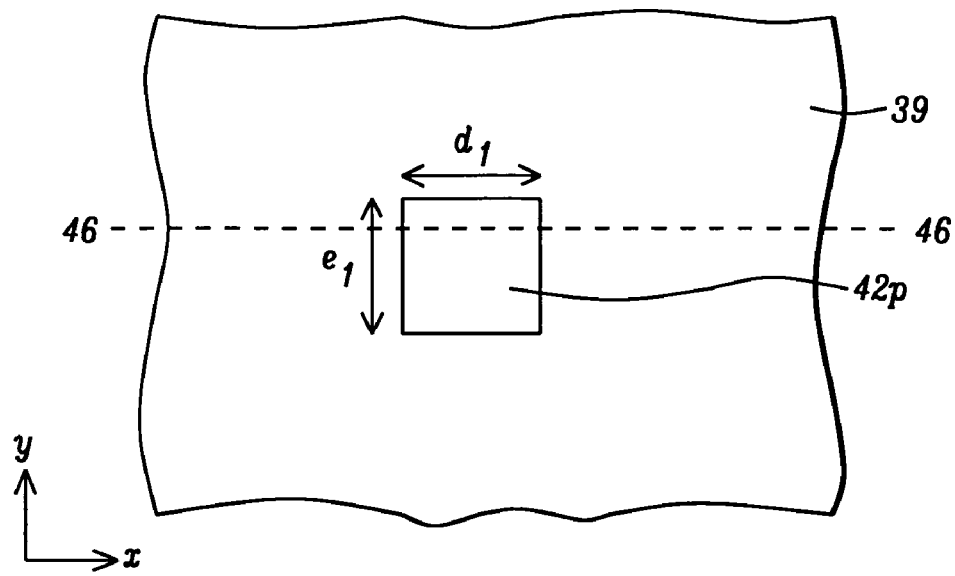

Referring to FIGS. 9a, 9b, a third etch step is performed to transfer the second parallel line pattern comprised of second photoresist lines 45 into the remaining composite hard mask layer comprised of parallel lines 41a. A similar fluorocarbon etch chemistry and conditions to those used in the first etch step may be employed. The third etch step stops on the lower hard mask layer 40a and thereby forms a post pattern comprised of posts (islands) 41b having a dimension $d_1$ along the x-axis and $e_1$ along the y-axis. Note that the third etch transfer generates a width $e_1$ in the upper hard mask layer 41b that may be slightly different than e due to the nature of the etching process. Any remaining second photoresist layer 45 is stripped by an oxygen plasma after the third etch step.

The next step in formation of an MTJ structure is transfer of the post pattern 41b through the underlying layers in the MTJ stack of layers. In a fourth etch step, a plasma comprised of $CH_3OH$ or the like is employed to transfer the post 41b through underlying line 40a to generate a post 42p having a top layer 41b and a lower layer 40b as illustrated in FIG. 9a which is a cross-section taken along the plane 46-46 in FIG. 9b. From a top-view perspective in FIG. 9b, the post 40p is shown as having a square or rectangular shape. It should be understood, however, that the corners on the post 40p may be rounded somewhat because of small linewidth variations in the second photoresist line 45 where the line crosses over the edges of upper hard mask layer 41a. These linewidth variations can translate into rounded corners on the post 42p following the fourth etch step. Therefore, the present invention also anticipates a hard mask post 42p that has a circular or elliptical shape which is desirable for MTJ elements. Unlike conventional MRAM where an elliptical MTJ shape is preferred in order to maintain the desired magnetic stability, the MTJ shape for a STT-MRAM is believed not to be so dependent on shape and a rectangular or elliptical MTJ are equally acceptable. When $e_1$ is unequal to $d_1$, the easy-axis direction is preferably the one that has the greater dimension $e_1$ or $d_1$.

Figure 10A:
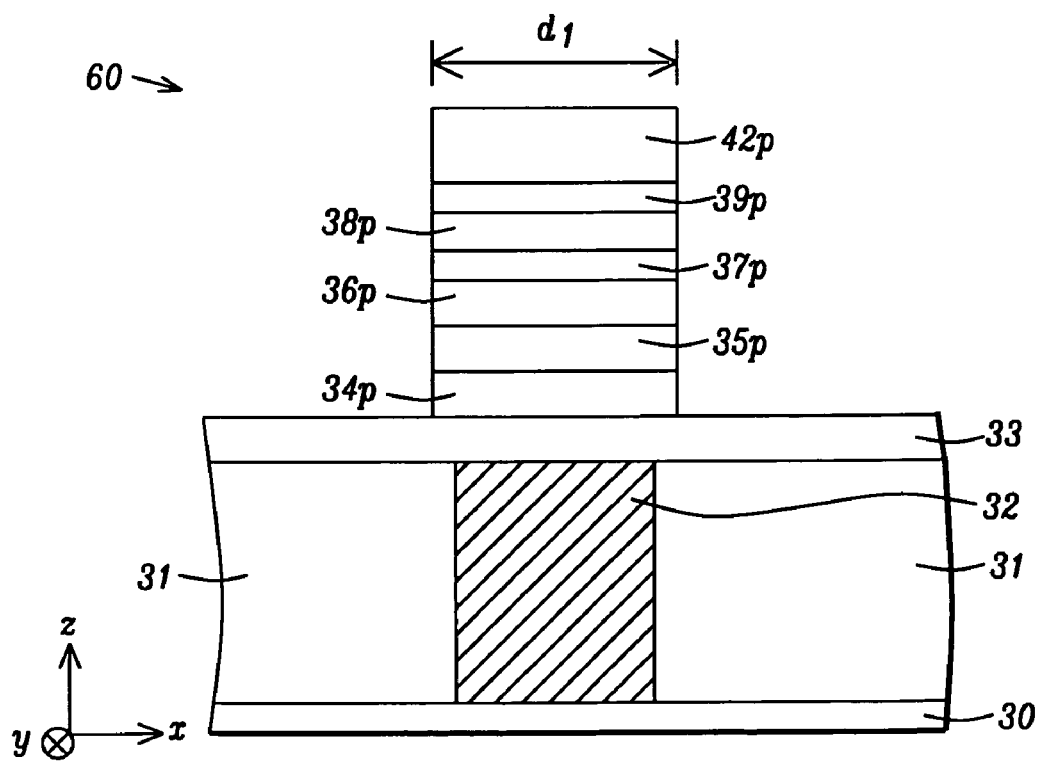
FIG. 10a and FIG. 10b are cross-sectional and top-down views, respectively, after the post pattern in the composite hard mask is transferred through the MTJ stack of layers to form a MTJ element according to a first embodiment of the present invention.
Figure 10B:
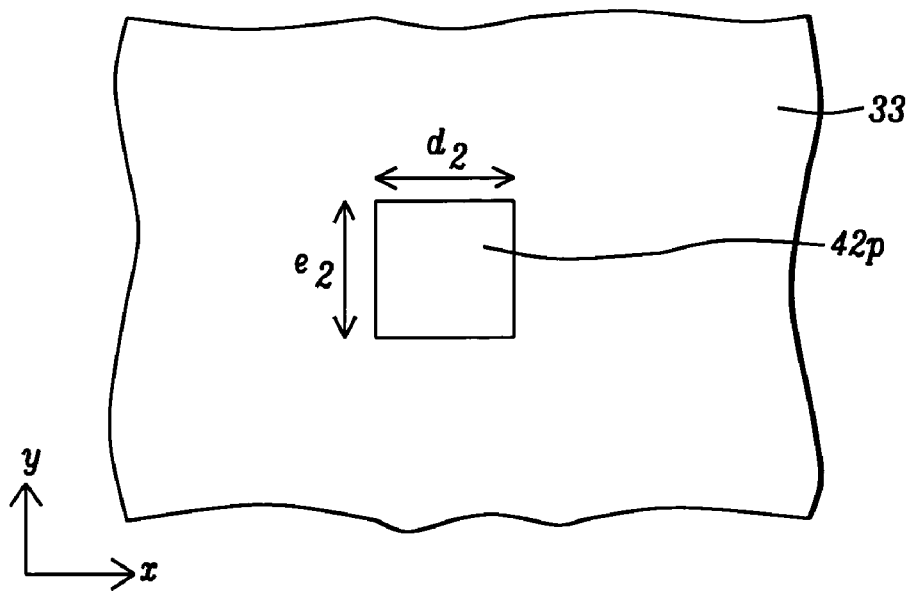

Referring to FIGS. 10a, 10b, the fourth etch step is continued and transfers the hard mask post shape 42p through the remaining stack of MTJ layers and stops on the bottom electrode 33. As a result, MTJ layers 34-39 are transformed into post shapes that have essentially the same dimensions ($d_1$, $e_1$) as hard mask post 42p from a top-view in FIG. 10b and the resulting MTJ element has essentially vertical sidewalls. Those skilled in the art will appreciate that a portion of the top surface and edges of the composite hard mask layer shown as post 42p may be eroded during the fourth etch step which stops on the bottom electrode layer 33. The fourth etch step may comprise $CH_3OH$, $C_2H_5OH$, or $CO/NH_3$ plasma which selectively etches exposed regions of the hard mask spacer 39 (and MTJ layers 34-38) substantially faster than upper hard mask layer 41b. It is believed that the NiCr etch in $CH_3OH$ plasma removes the Ta etch by-products that are redeposited during the Ta etch in $CF_4$ plasma. Thus, metal etch residues that can degrade device performance in prior art MTJ structures are essentially eliminated by insertion of a lower hard mask layer 40 made of NiCr or the like.

Alternatively, the hard mask post shape 42p is transferred through the hard mask spacer 39 and at least a portion of the free layer 38 (not shown) during the fourth etch step. All of the MTJ layers below hard mask post 42p preferably have an etch rate of about 5 to 15 times faster than the upper layer 41b in the hard mask post during the fourth etch step. In this embodiment, the resulting MTJ element may be comprised of a post structure having layers 38p-42p formed on a stack of layers 34-37. When the third etch step stops inside the free layer 38, then the remaining portion of the free layer above the tunnel barrier layer 37 and not underlying the free layer post 38p is oxidized to electrically insulate the STT-MRAM 60 from adjacent STT-MRAM devices. For example, a natural oxidation (NOX) or radical oxidation (ROX) may be employed to transform the remaining free layer 38 to an insulation layer (not shown). Typically, the oxidation is a short process and only a small amount of oxygen is expected to diffuse into the free layer. Even so, it is known in the art that a small amount of oxygen dopant in a free layer may actually enhance the performance of a MTJ.

Subsequent process steps to complete the STT-MRAM 60 are not illustrated but preferably comprise etching the bottom electrode layer 33 to form a plurality of bottom electrodes (not shown) and deposition of an insulation layer on the plurality of bottom electrodes to a level that covers the hard mask post 42p. Alternatively, the bottom electrode layer 33 may be etched prior to depositing the MTJ stack of layers and etching to form MTJ elements. Once the fourth etch step is completed, an insulation layer may be deposited and planarized at a level that is about coplanar with the hard mask post 42p. In one embodiment, the CMP step used to planarize the insulation layer stops above the hard mask post 42p and a RIE process is used to remove an upper portion of the insulation layer and thereby uncover the hard mask post 42p. Thereafter, a plurality of bit lines may be formed on the insulation layer by an electroplating method, for example. One of the bit lines contacts the top surface of hard mask post 42p.

In a second embodiment of the present invention represented by the process steps shown in FIGS. 11a-16b, a CD in an easy-axis dimension and a CD in a hard-axis dimension are again defined in separate photolithography steps involving parallel line patterns. However, the first $CH_3OH$ etch step described in the first embodiment is modified to allow additional flexibility in the STT-MRAM design.

Figure 11A:
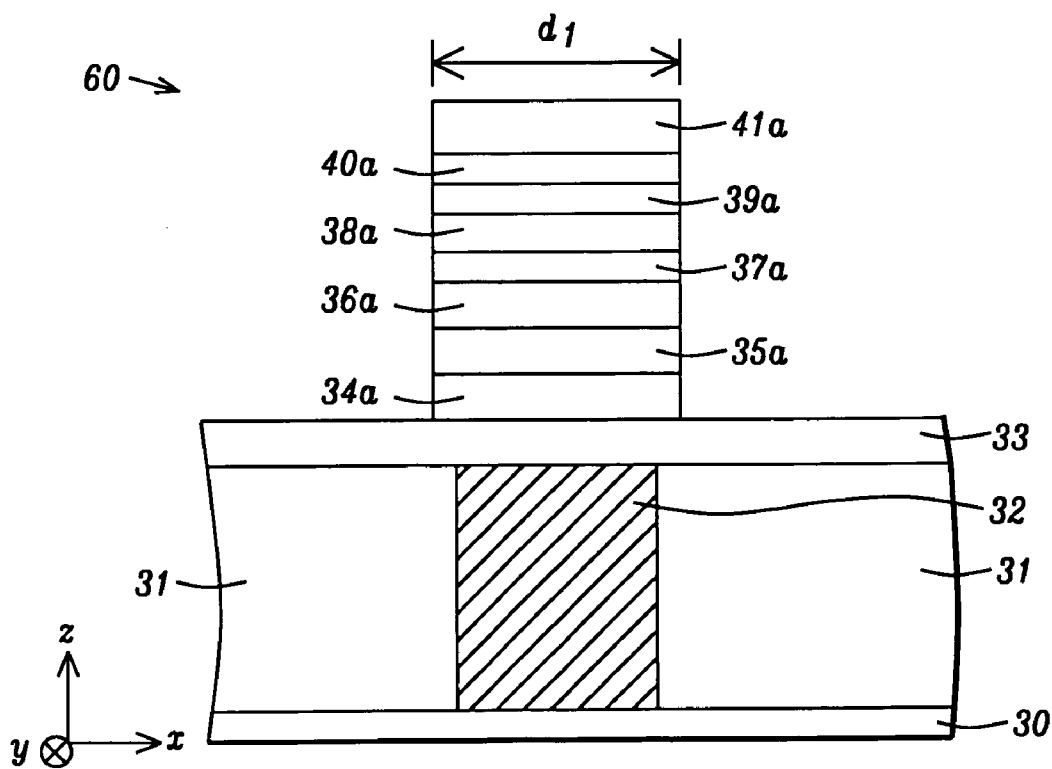
FIG. 11a and FIG. 11b are cross-sectional and top-down views, respectively, after the first photoresist pattern in FIGS. 6a, 6b is transferred by an etch step through the MTJ stack of layers according to a second embodiment of the present invention.
Figure 11B:
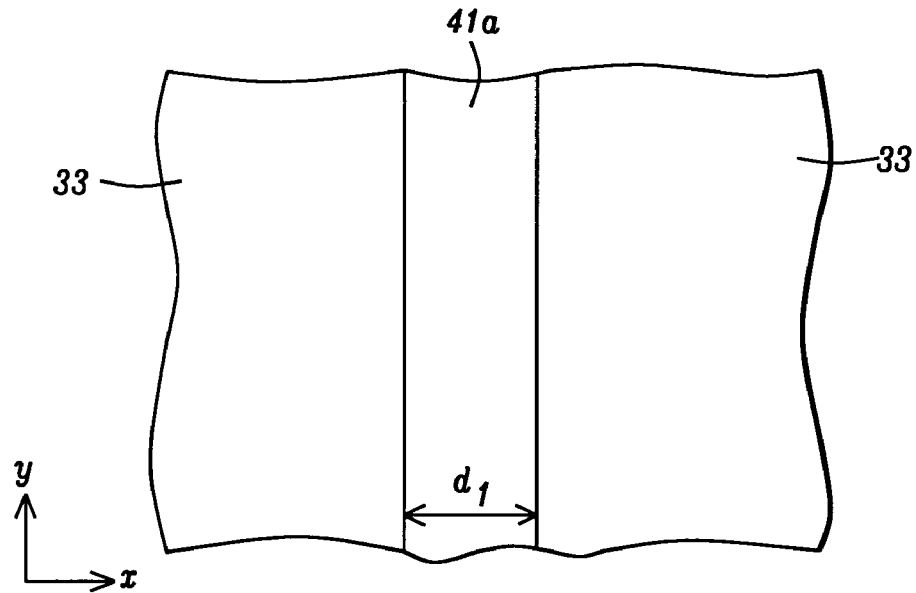

Referring to FIGS. 11a, 11b, the etch sequence after the first photolithography patterning step is modified. The parallel photoresist line pattern shown in FIGS. 6a, 6b is transferred through the upper hard mask layer 41 as before to generate a plurality of parallel lines 41a. The photoresist layer may be stripped with oxygen plasma at this point. Then, the second etch step with $CH_3OH$ plasma is used to etch the lower hard mask layer 40a. Furthermore, the second etch step continues through the entire stack of MTJ layers 34-40 to provide a plurality of parallel lines having linewidth $d_1$ in the x-axis direction. Note that the seed layer 34a, AFM layer 35a, pinned layer 36a, tunnel barrier layer 37a, free layer 38a, hard mask spacer layer 39a, lower hard mask layer 40a, and upper hard mask layer 41a all have essentially the same width $d_1$.

In an alternative embodiment (not shown), the first fluorocarbon etch step transfers the parallel line pattern through the upper hard mask layer 41 and the first photoresist layer is removed by oxygen plasma. Then the first $CH_3OH$ etch step transfers the resulting parallel line pattern through the lower hard mask layer 40, hard mask spacer 39, and at least an upper portion of the free layer 38. In this example (not shown), the first $CH_3OH$ etch may stop on the tunnel barrier layer 37 or in the free layer 38. In the latter case, the remaining portion of the free layer 38 above the tunnel barrier is oxidized as in the first embodiment to insulate the upper section (layers 38a-41a) of the MTJ element from adjacent STT-MRAMs 60. As noted earlier, a small amount of oxygen may diffuse into the upper portion of the free layer designated as free layer 38a.

Figure 12:
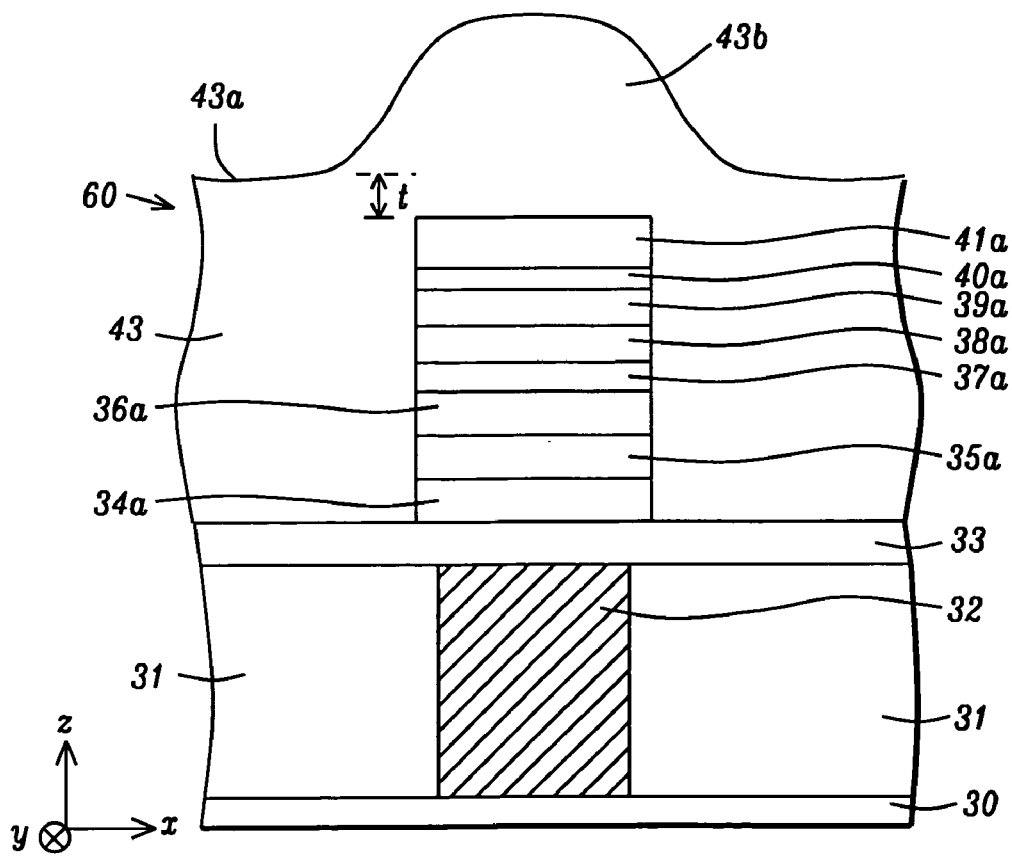
FIG. 12 is a cross-sectional view of the etched structure in FIG. 11a after an insulation layer is deposited to a level that covers the hard mask layer.

Referring to FIG. 12, a second insulation layer 43 made of $SiO_2$, $Al_2O_3$, or other dielectric material is deposited on the partially formed STT-MRAM 60 in FIGS. 11a-11b. The top surface 43a of the second insulation layer is planar except for a bump 43b formed over upper hard mask layer 41a. Preferably, the top surface 43a is a certain distance t above the upper hard mask layer 41a. The deposition may take place in a CVD chamber outside the sputter deposition mainframe used to deposit the MTJ layers. However, to improve throughput, the insulation layer may also be laid down in a sputter chamber within the sputter deposition mainframe.

Figure 13A:
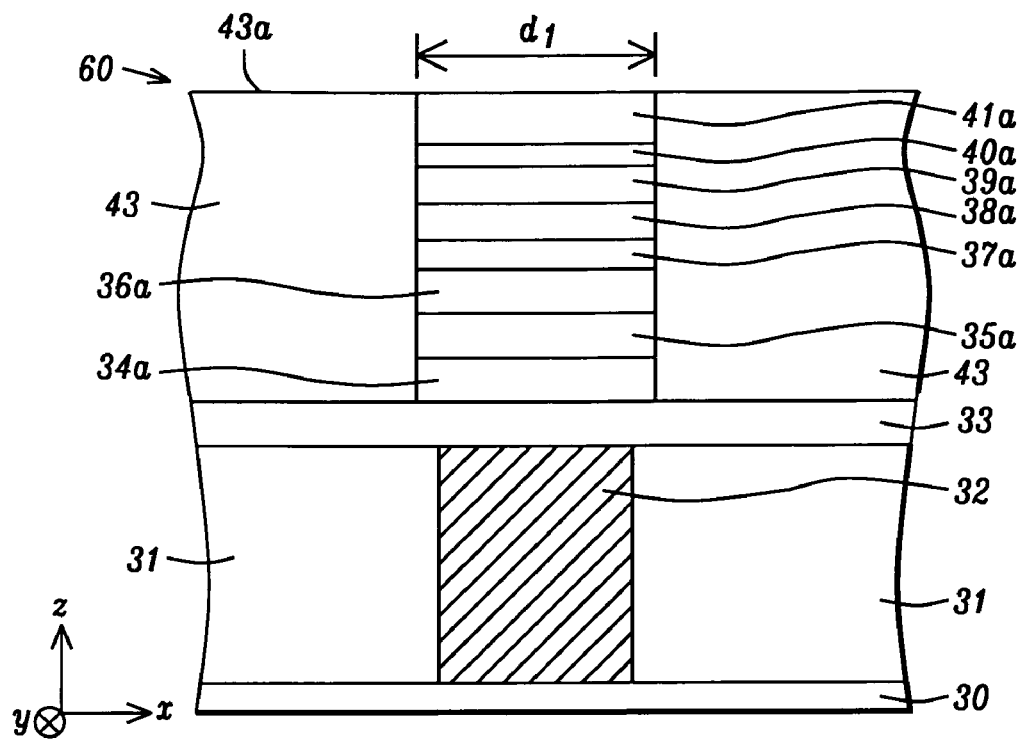
FIG. 13a and FIG. 13b are cross-sectional and top-down views, respectively, of the MTJ structure in FIG. 12 after a CMP step to planarize the insulation layer.
Figure 13B:
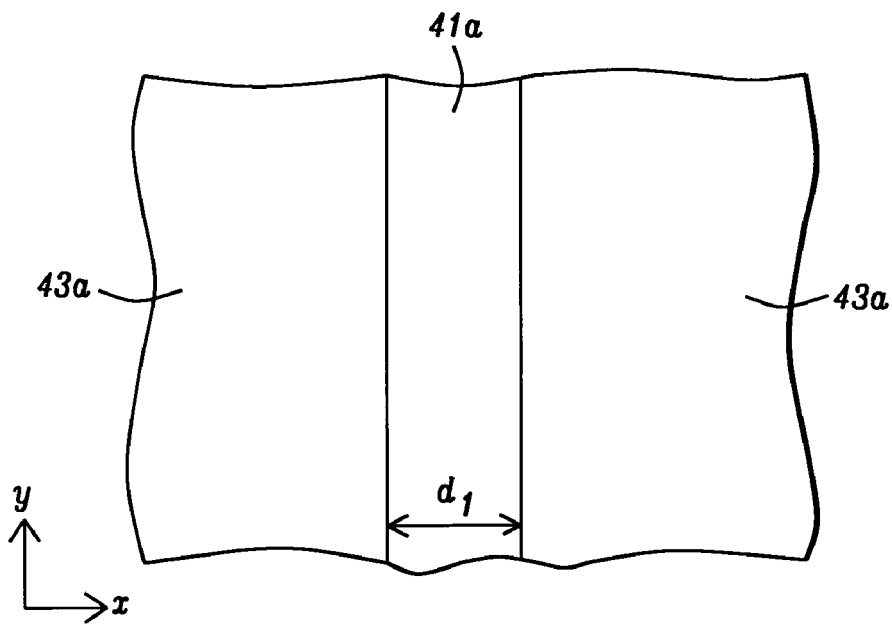

Referring to FIGS. 13a-13b, a CMP process is performed to planarize the second insulation layer 43 so that the top surface 43a is coplanar with upper hard mask layer 41a. Optionally, the top surface 43a may be planarized at a level that is above the upper hard mask layer 41a.

Figure 14A:
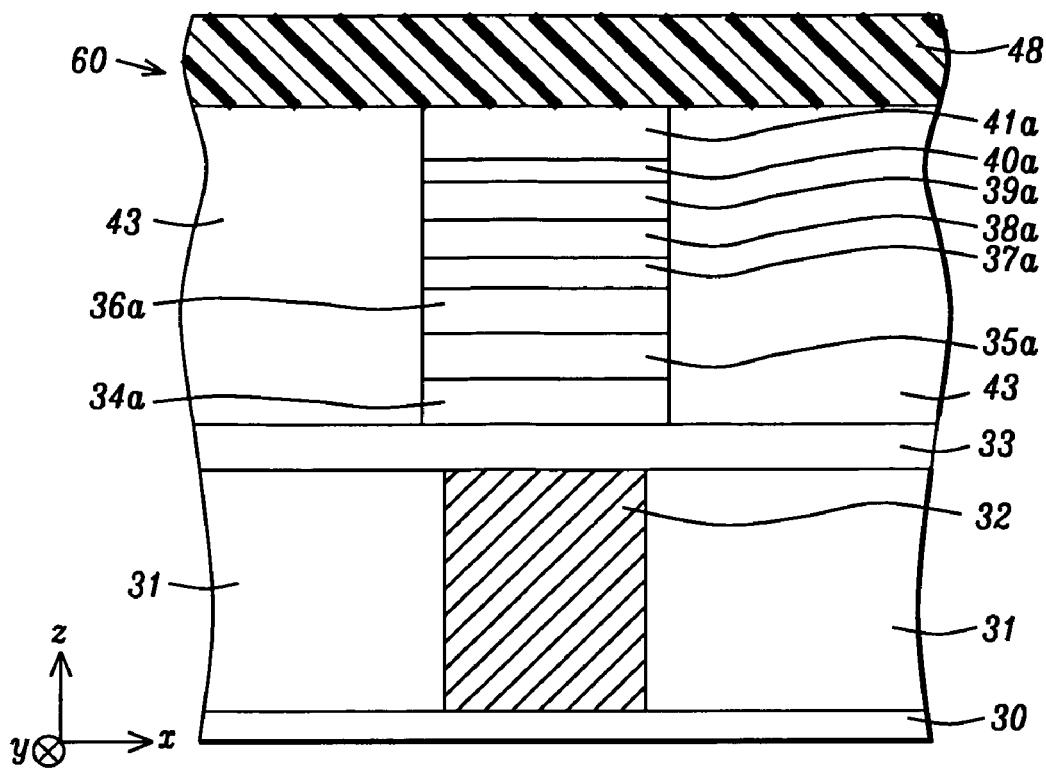
FIG. 14a and FIG. 14b are cross-sectional and top-down views, respectively, of the MTJ structure in FIGS. 13a, 13b after a second photoresist pattern is formed on the composite hard mask and insulation layer according to the second embodiment.
Figure 14B:
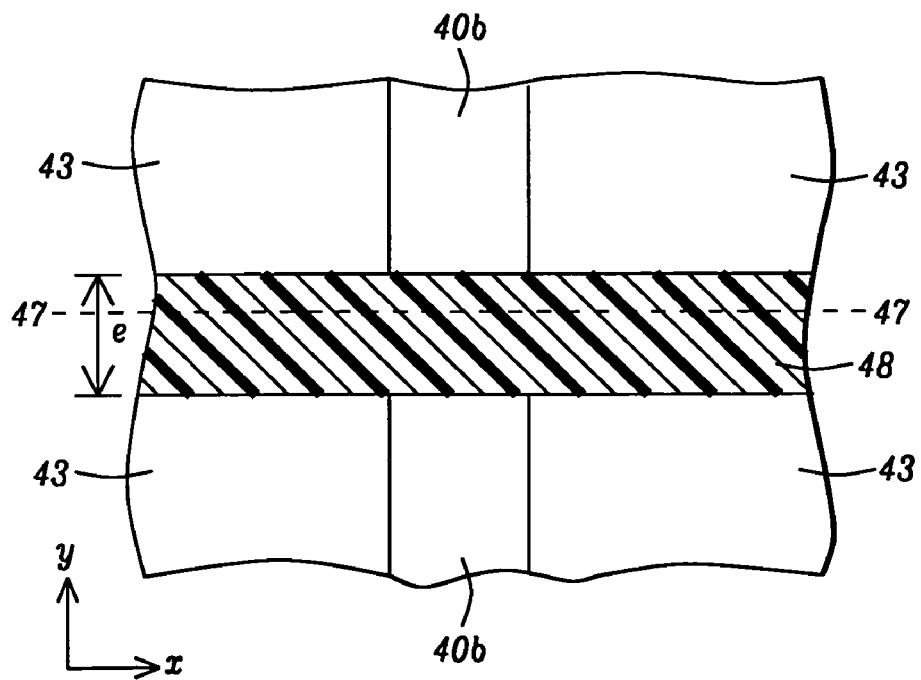

In FIGS. 14a-14b, a second photoresist layer is coated on the second insulation layer 43 and is patterned in a second photolithography step to generate a parallel line pattern comprised of a plurality of photoresist lines 48. In one aspect, each photoresist line 48 is formed perpendicular to the hard mask lines 41a. However, the present invention also encompasses an embodiment in which each photoresist line 48 intersects a plurality of hard mask lines 41a at an angle between 0 and 90°. As in the first embodiment, the photoresist lines 48 formed in the second photoresist patterning step have a width e in the y-axis direction that corresponds to the CD in hard-axis direction or easy-axis direction of the subsequently formed MTJ element. Since the second photoresist layer is coated on a planar surface, the process window for forming the parallel photoresist lines 48 should be larger than in the first embodiment where the second photoresist layer is coated over topography (hard mask lines 41a above hard mask spacer 39).

Figure 15A:
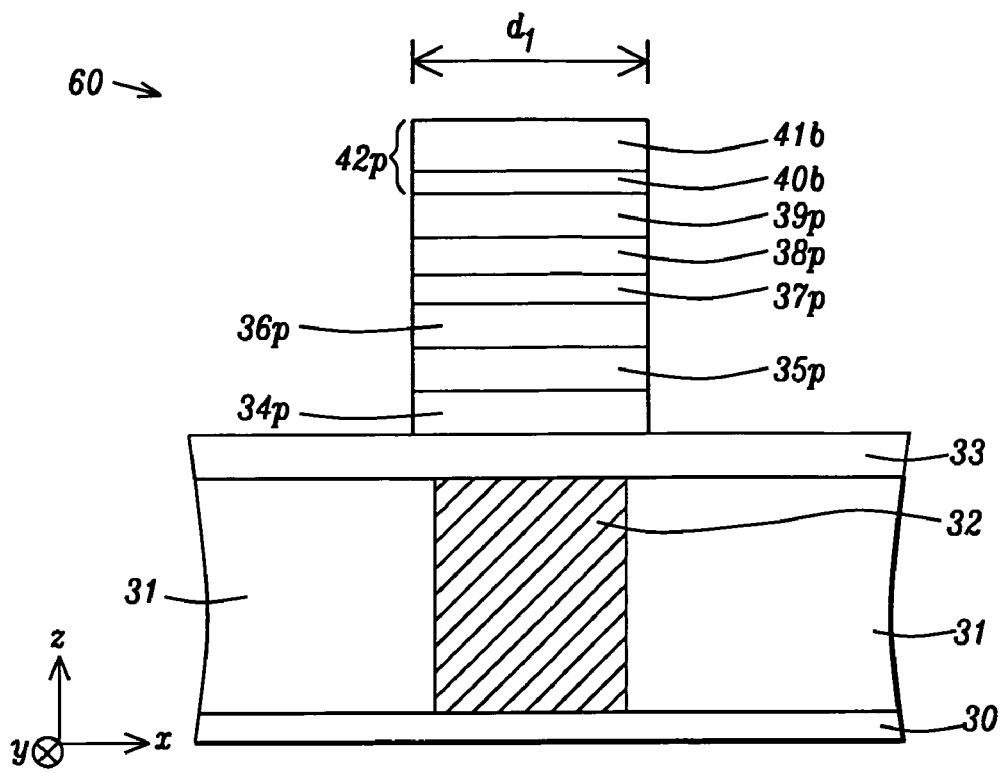
FIG. 15a and FIG. 15b are cross-sectional and top-down views, respectively, after the second photoresist pattern in FIGS. 14a, 14b, respectively, is etch transferred through the MTJ stack of layers.
Figure 15B:
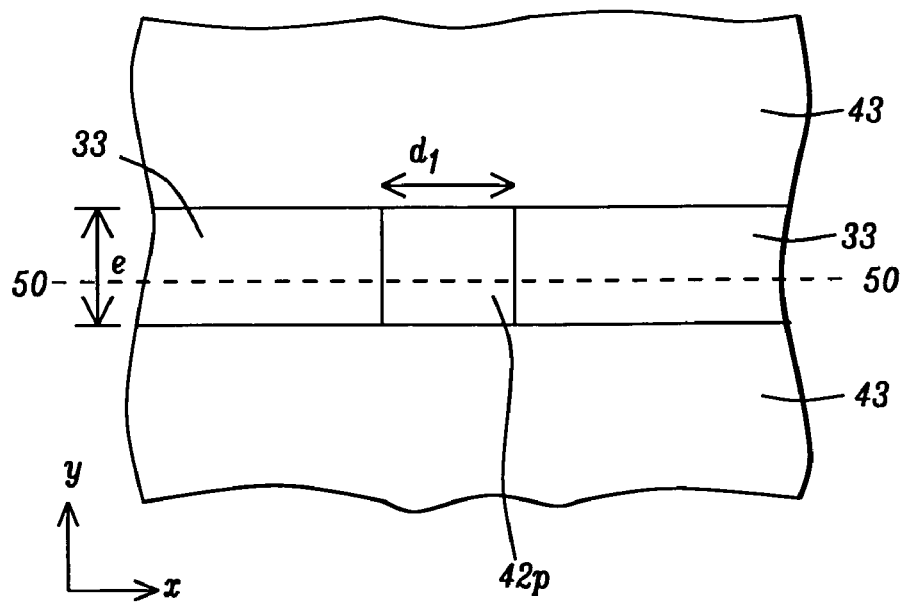
Figure 16A:
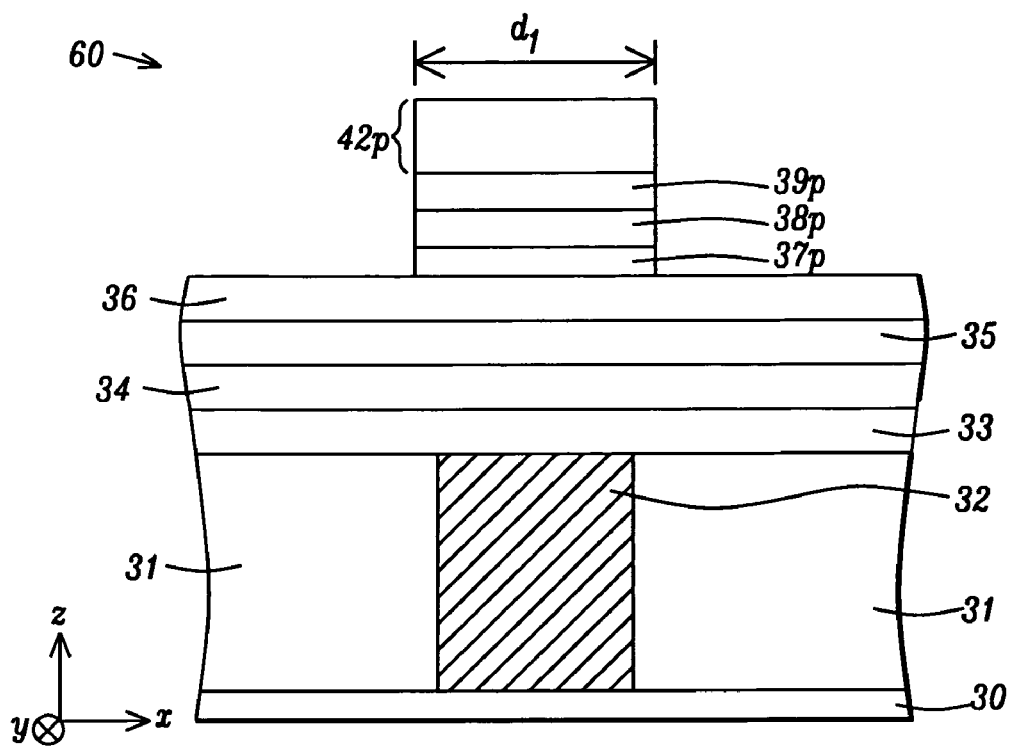
FIG. 16a and FIG. 16b are cross-sectional and top-down views, respectively, after the second photoresist pattern in FIGS. 14a, 14b, respectively, is etch transferred through the free layer and stops on the tunnel barrier layer according to another embodiment of the present invention.

Referring to FIGS. 15a-15b, a second fluorocarbon plasma etch step is performed to transfer the line pattern in the second photoresist layer through the upper hard mask line 41a. Thereafter, the photoresist layer 48 is removed by oxygen plasma. Next, a fourth etch step (second $CH_3OH$ plasma etch) is employed to transfer the resulting post pattern 41b through the lower hard mask line 40a and underlying MTJ stack of layers 34-39. From a top-view, the resulting hard mask post 42p has a width $d_1$ along the x-axis and a width $e_1$ along the y-axis. In a design where $d_1$ is unequal to $e_1$, the easy-axis is generally the axis associated with the larger of the two values ($d_1$ or $e_1$). Furthermore, the remaining layers 34a-39a in the MTJ stack of layers are transformed into post shapes 34p-39p (from a top-view) having essentially the same area dimensions ($d_1 \times e_1$) as the hard mask post 40p. The second insulation layer 43 also has a width $e_1$ along the x-axis and is coplanar with the hard mask post 42p except for a trench where bottom electrode 33 is exposed in regions that were uncovered during the fourth etch. Note that the cross-sectional view in FIG. 16a is taken along plane 50-50 in FIG. 16b. In this embodiment, a third insulation layer (not shown) will be subsequently deposited in the trench opening above exposed regions of bottom electrode 33. In addition, a second CMP process is required to make the third insulation layer coplanar with second insulation layer 43.

Figure 16B:
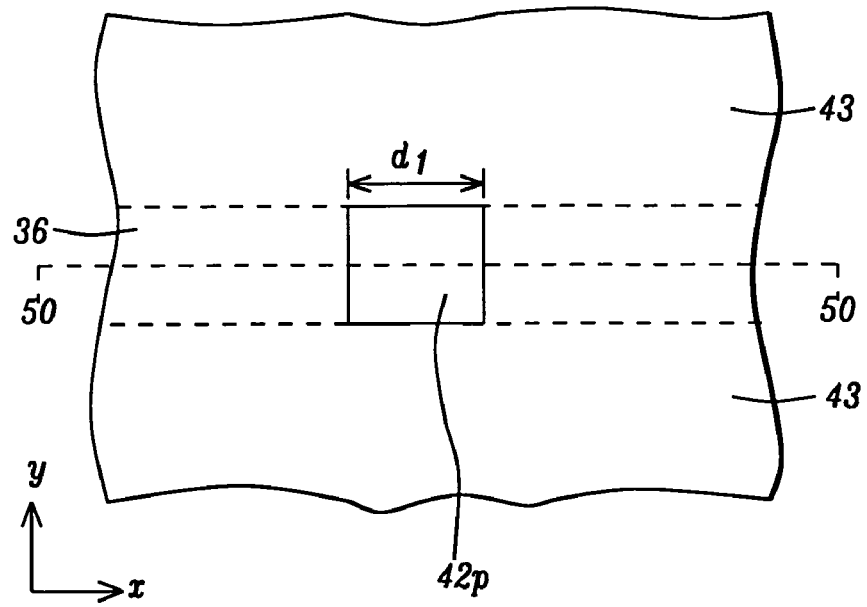

In FIGS. 16a-16b, an alternative embodiment is depicted in which the post shape 42p formed during the second fluorocarbon etch step in the previous embodiment is transferred through the lower hard mask line 40a, hard mask spacer 39 and at least a portion of the free layer 38 during the second $CH_3OH$ etch step. In this embodiment, the resulting MTJ element may be comprised of a post structure having layers 38p-42p formed on a stack of layers 34-37. When the second $CH_3OH$ etch step stops inside the free layer 38, then the remaining portion of the free layer above the tunnel barrier layer 37 is oxidized to electrically insulate the STT-MRAM 60 from adjacent STT-MRAM devices. For example, a NOX or ROX process may be employed to transform the remaining free layer 38 to an insulation layer (not shown). The cross-sectional view in FIG. 16a is taken along plane 50-50 in FIG. 16b. In the exemplary embodiment depicted in FIG. 16b, a third insulation layer (not shown) will be subsequently deposited to fill the trench opening that exposes portions of pinned layer 36. Then a CMP step will be required to make the third insulation layer coplanar with second insulation layer 43.

To summarize the second embodiment, the combination of the two photolithography steps and four etch steps that determine the CDs along the easy-axis and hard-axis directions may result in at least four configurations represented by FIGS. 15a-15b and FIGS. 16a-16b. In one aspect, the first $CH_3OH$ etch and second $CH_3OH$ etch may both stop on the bottom electrode layer 33. In a second configuration, the first $CH_3OH$ etch and second $CH_3OH$ etch may both stop on the tunnel barrier layer 37 or inside the free layer 38. In a third configuration, the first $CH_3OH$ etch may stop on the bottom electrode and the second $CH_3OH$ etch may stop on the tunnel barrier layer (or inside the free layer). The present invention anticipates that an axis through post 42p and parallel to plane 50-50 may be either an easy-axis or a hard axis in the MTJ element.

As mentioned previously with regard to STT-MRAM 60, the bottom electrode 33 may be patterned before the MTJ stack of layers 34-41 is laid down or after the post comprised of layers 34p-42p is formed following the fourth etch step.

All of the aforementioned embodiments provide an advantage over existing MTJ fabrication methods in that the CD for the easy-axis dimension and the CD for the hard-axis dimension are determined in separate photolithography steps and thereby enable greater control especially in terms of uniformity of the MTJ area ($e_1 \times d_1$) from a top view. Moreover, smaller $e_1$ and $d_1$ dimensions can be generated than with a conventional single patterning approach. Separate photolithography steps also enable the photolithography exposure tool to print smaller CDs with a larger process window since only one dimensional control is needed for each step rather than two dimensional control. Furthermore, a thicker photoresist layer may be employed for the first and second photolithography steps since there is substantially less danger for line collapse than post collapse in two dimensional CD imaging methods. Thus, the lifetime of photolithography exposure tools can be extended and less rework is necessary which are both cost-effective outcomes. An additional benefit provided by the present invention is that the composite hard mask layer comprised of NiCr/Ta, for example, prevents metal residue formation and buildup during the etch processes and provides for improved device shape integrity with higher performance.

Comparative Example 1

An array of MTJ cells was fabricated by a previous method practiced by the inventors and a second array of MTJ cells was fabricated according to a method described herein to demonstrate the effectiveness of a composite hard mask layer according to the present invention. In sample A, a stack of MTJ layers was formed on a bottom electrode to prepare an array of reference MTJ structures according to a method previously employed to fabricate an older generation MRAM array. The MTJ stack of layers is comprised of a NiCr seed layer, MnPt AFM layer, CoFe/Ru/CoFeB SyAP pinned layer, MgO tunnel barrier, CoFe/NiFe free layer, a 250 Angstrom thick MnPt hard mask spacer, and a 320 Angstrom thick Ta hard mask layer which were sequentially formed on a bottom electrode. For sample B, the aforementioned MTJ stack of layers was modified by inserting a 30 Angstrom thick NiCr lower hard mask layer between the MnPt hard mask spacer and Ta upper hard mask layer. In both samples, an array of MTJ structures having oval shapes of 70 nm×210 nm ovals was formed. Adjacent MTJ structures with a top hard mask post 42p are separated by dummy MTJ cells 71 that are used to improve the planarization uniformity in a subsequent CMP step. Note that the MTJ structures 70 in FIG. 17 (sample A) and MTJ structures having hard mask posts 42p in FIG. 18 (sample B) are overlaid on bottom electrodes 74 and 33, respectively, which are larger ovals with a long axis oriented in a direction perpendicular to the long axis of the smaller ovals.

An Anelva 4500 was used to perform the etch processes for both samples A and B. Each of the two etch processes to construct a Ta hard mask post in sample A involved $CF_4$ plasma with an RF power of 500 Watts (top) and 52 W (bottom) and a 50 sccm $CF_4$ flow rate, 4.5 mTorr pressure until end point (indicated by NiCr signal) is reached to pattern the Ta hard mask layer. A first photoresist patterning and $CF_4$ etch sequence was employed to form a line pattern in the Ta hard mask layer. Then a second photoresist patterning and $CF_4$ etch sequence was used to form an array of Ta hard mask posts (ovals) on the MnPt hard mask spacer layer. Thereafter, a $CH_3OH$ etch with an RF power of 1500 W (top) and 1300 W (bottom) with a 15 sccm flow rate, 3 mTorr pressure) until end point was reached (indicated by BE signal) was performed to transfer the Ta hard mask oval shape through the underlying MTJ layers and stopping on the bottom electrode 74.

Figure 17:
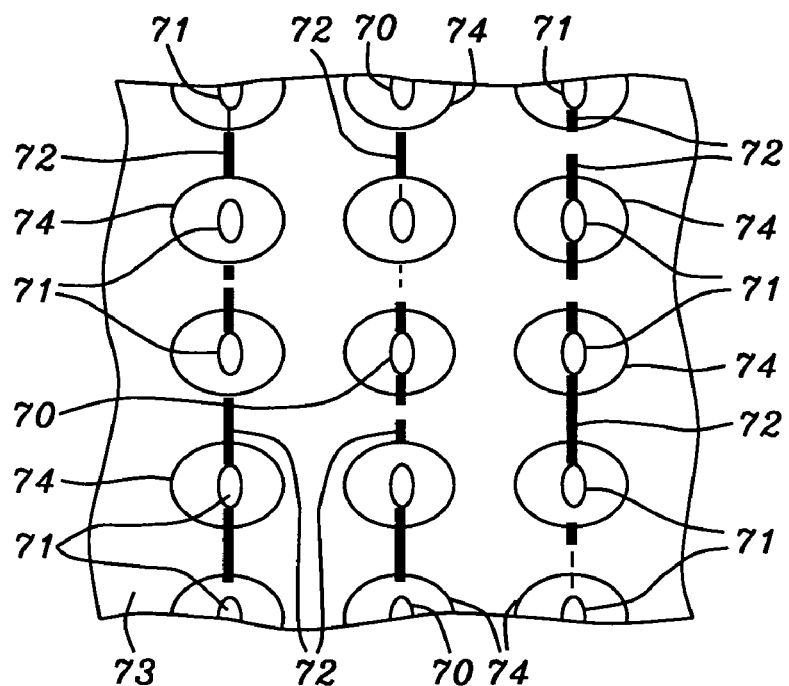
FIG. 17 is a top-down view of an array of MTJ cells after a MTJ etch according to a prior art process where metal residue builds up between MTJ cells when the hard mask is comprised of only Ta with no NiCr underlayer.

Referring to FIG. 17, a top-down view is shown of the MTJ array formed on a substrate 73 in sample A. Note that the top surface of the MTJs 70 and dummy MTJs 71 in each MTJ structure have an oval shape but there is metal residue 72 that contacts a plurality of MTJ structures. In addition, there is a significant amount of metal residue 72 formed between adjacent MTJ structures, generally along a plane that bisects the bottom electrodes 74 along a short axis direction. In certain regions, the metal residue 72 completely bridges the gap between adjacent MTJ structures and thereby causes device shunting. Although it is possible to remove a substantial amount of the metal residue by overetching by 50 seconds for a total $CH_3OH$ etch time of 170 seconds, the resulting MTJs are degraded since the overetch causes a roughening at the edge of the MTJ ovals and a shrinkage of the MTJ oval shape leading to a loss in performance.

Figure 18:
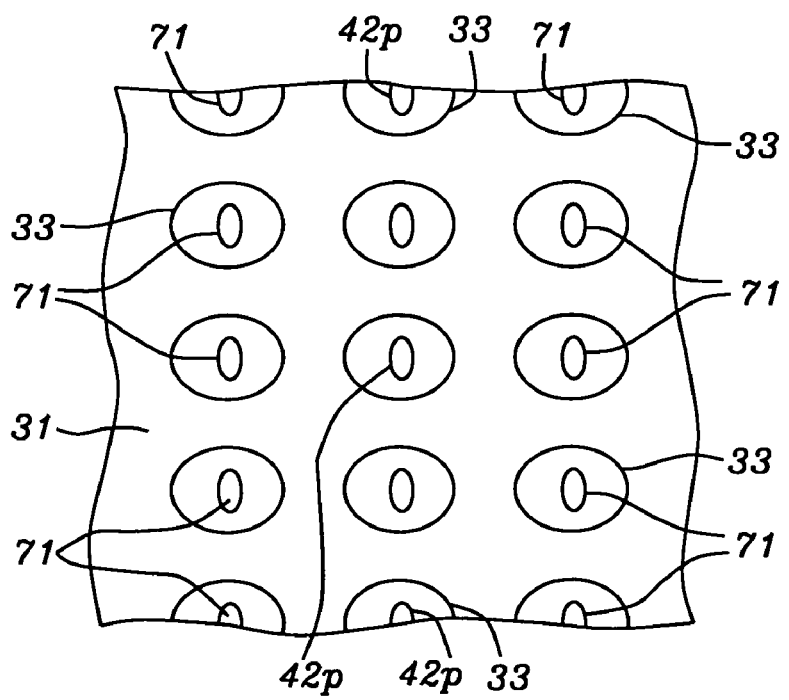
FIG. 18 is a top-down view of an array of MTJ cells after a MTJ etch according to a method of the present invention where a composite hard mask having a NiCr/Ta configuration is employed at the top of the MTJ stack of layers.

Referring to FIG. 18, a top-down view of the MTJ array formed in sample B is depicted. This illustration represents an embodiment wherein a first photoresist layer is patterned followed by a first $CF_4$ etch to transfer the line pattern through the upper Ta hard mask layer and stopping on the lower NiCr hard mask layer. The first photoresist is removed by $O_2$ plasma and then the line pattern in the Ta hard mask is transferred through the lower NiCr hard mask with a first $CH_3OH$ etch using conditions as described for sample A. After an oxygen plasma treatment comprised of an $O_2$ flow rate of 100 sccm and RF power of 500 Watts for 5 seconds, a second photoresist layer is patterned as disclosed previously and a second $CF_4$ etch is performed to create an array of Ta hard mask posts. First and second $CF_4$ etch conditions are the same as those used to make sample A. The second photoresist is stripped with oxygen plasma and then the post pattern is transferred through the lower NiCr hard mask and through the underlying MTJ layers with a second $CH_3OH$ etch similar to the first $CH_3OH$ etch and stopping on a bottom electrode 33 to produce an array of MTJ oval shaped pillars from a top-down perspective that have a top post 42p as the uppermost layer. Because of the insertion of a lower NiCr hard mask layer, there is no metal residue formation or buildup as in sample A. Therefore, the MTJ shape integrity is retained because overetch conditions are not necessary to remove unwanted metal residue.

While this invention has been particularly shown and described with reference to, the preferred embodiment thereof, it will be understood by those skilled in the art that various changes in form and details may be made without departing from the spirit and scope of this invention.

We claim:

1. A method of fabricating a MTJ element having essentially vertical sidewalls and with a top surface having an area determined by a first dimension along a first axis and a second dimension along a second axis, said MTJ element has a stack of layers comprised of a seed layer, AFM layer, pinned layer, tunnel barrier, free layer, hard mask spacer layer, and composite hard mask layer with a lower NiCr layer and an upper Ta layer formed in order from bottom to top on a substrate, comprising:

(a) forming the MTJ stack of layers on said substrate;

(b) patterning a first photoresist layer on the composite hard mask layer to form a first parallel line pattern wherein each line has a width that is the first dimension along the first axis;

(c) transferring said first parallel line pattern through the composite hard mask layer with a first etch sequence comprising:

(1) performing a first fluorocarbon plasma etch step to form a parallel line pattern in the upper hard mask layer;

(2) removing the first photoresist layer with an oxygen plasma;

(3) performing a first $CH_3OH$ plasma etch to transfer the parallel line pattern in the upper hard mask layer through the lower hard mask layer; and (4) performing an oxygen plasma to treat exposed surfaces following the first $CH_3OH$ plasma etch, (d) patterning a second photoresist layer on the parallel line pattern and hard mask spacer layer to form a second parallel line pattern wherein each line in the second parallel line pattern intersects the hard mask parallel lines and has a width that is the second dimension along the second axis;

(e) transferring said second parallel line pattern through the composite hard mask layer by a second etch sequence to form a post pattern wherein each post has an area determined by the first dimension and second dimension, said second etch sequences comprises;

(1) performing a second fluorocarbon plasma etch step to form a post pattern in the upper hard mask layer;

(2) removing the second photoresist layer with an oxygen plasma; and (3) performing a second $CH_3OH$ plasma etch to transfer the post pattern in the upper hard mask layer through the lower hard mask layer; and (f) continuing the second $CH_3OH$ step to transfer the post pattern through the remaining layers in the MTJ stack of layers to form a plurality of MTJ elements.

2. The method of claim 1 wherein one or both of the first dimension and second dimension are critical dimensions that are about 100 nm or less and the MTJ element is formed in a STT-MRAM device.

3. The method of claim 1 wherein the upper hard mask layer has a thickness of less than about 500 Angstroms and the lower hard mask layer has a thickness of less than about 50 Angstroms.

4. The method of claim 1 wherein the hard mask spacer layer has a thickness of about 200 to 800 Angstroms and is comprised of MnPt.

5. The method of claim 1 wherein the first dimension is greater than the second dimension and the first axis is the easy-axis of the MTJ element.

6. A method of fabricating a MTJ element with a top surface having an area determined by a first dimension along a first axis and a second dimension along a second axis, said MTJ element has a stack of layers comprised of a seed layer, AFM layer, pinned layer, tunnel barrier, free layer, hard mask spacer layer, and composite hard mask layer with a lower NiCr layer and an upper Ta layer formed in order from bottom to top on a substrate, comprising:
 (a) forming the MTJ stack of layers on said substrate;
 (b) patterning a first photoresist layer on the composite hard mask layer to form a first parallel line pattern wherein each line has a width that is the first dimension along the first axis;
 (c) transferring said first parallel line pattern through the composite hard mask layer with a first etch sequence comprising:
  (1) performing a first fluorocarbon plasma etch step to form a parallel line pattern in the upper hard mask layer;
  (2) removing the first photoresist layer with an oxygen plasma;
  (3) performing a first $CH_3OH$ plasma etch to transfer the parallel line pattern in the upper hard mask layer through the lower hard mask layer; and
  (4) performing an oxygen plasma to treat exposed surfaces following the first $CH_3OH$ plasma etch,
 (d) patterning a second photoresist layer on the parallel line pattern and hard mask spacer layer to form a second parallel line pattern wherein each line in the second parallel line pattern intersects the hard mask parallel lines and has a width that is the second dimension along the second axis;
 (e) transferring said second parallel line pattern through the composite hard mask layer by a second etch sequence to form a post pattern wherein each post has an area determined by the first dimension and second dimension, said second etch sequences comprises;
  (1) performing a second fluorocarbon plasma etch step to form a post pattern in the upper hard mask layer;
  (2) removing the second photoresist layer with an oxygen plasma; and
  (3) performing a second $CH_3OH$ plasma etch to transfer the post pattern in the upper hard mask layer through the lower hard mask layer; and
 (f) continuing the second $CH_3OH$ step to transfer the post pattern through the hard mask spacer layer and at least a portion of the free layer to form a plurality of MTJ elements.

7. The method of claim 6 wherein one or both of the first dimension and second dimension are critical dimensions that are about 100 nm or less and the MTJ element is formed in a STT-MRAM device.

8. The method of claim 6 wherein the second $CH_3OH$ plasma etch step stops on the tunnel barrier layer.

9. The method of claim 6 wherein second $CH_3OH$ plasma etch step stops in the free layer to form an upper section of the free layer having a post shape while a lower section of the free layer above the tunnel barrier layer and not underlying said post is not etched.

10. The method of claim 9 further comprised of oxidizing said lower section of the free layer to form an insulation layer between said MTJ element and adjacent MTJ elements in the plurality of MTJ elements.

11. The method of claim 6 wherein the upper hard mask layer has a thickness less than about 500 Angstroms, and the lower hard mask layer has a thickness less than about 50 Angstroms.

12. A method of fabricating a MTJ element with a top surface having an area determined by a first dimension along a first axis and a second dimension along a second axis, said MTJ element has a stack of layers and is comprised of a seed layer, AFM layer, pinned layer, tunnel barrier, free layer, hard mask spacer layer, and composite hard mask layer with a lower NiCr layer and an upper Ta layer formed in order from bottom to top on a substrate, comprising:
 (a) forming the MTJ stack of layers on said substrate;
 (b) patterning a first photoresist layer on the composite hard mask layer to form a first parallel line pattern wherein each line has a width that is the first dimension along the first axis;
 (c) transferring said first parallel line pattern through the composite hard mask layer and MTJ stack of layers with a first etch sequence comprising:
  (1) performing a first fluorocarbon plasma etch step to form a parallel line pattern in the upper hard mask layer;
  (2) removing the first photoresist layer with an oxygen plasma;
  (3) performing a first $CH_3OH$ plasma etch to transfer the parallel line pattern in the upper hard mask layer through the lower hard mask layer and through the MTJ stack of layers to form a parallel line pattern wherein each line has two sidewalls; and
  (4) performing an oxygen plasma to treat exposed surfaces following the first $CH_3OH$ plasma etch,
 (d) forming a planar insulation layer on the substrate and adjacent to the two sidewalls of each line and with a thickness that is about equal to said first thickness;
 (e) patterning a second photoresist layer on the insulation layer and above the parallel line pattern to form a second parallel line pattern wherein each second photoresist line has a width that is the second dimension along the second axis; and
 (f) transferring said second parallel line pattern through the upper Ta layer with a second fluorocarbon plasma etch and then through the lower NiCr layer and the MTJ stack of layers with a second $CH_3OH$ plasma etch step to form a post pattern comprised of a plurality of posts wherein each post has an area determined by the first dimension and second dimension.

13. The method of claim 12 wherein one or both of the first dimension and second dimension are critical dimensions that are about 100 nm or less and the MTJ element is formed in a STT-MRAM device.

14. The method of claim 12 wherein the planar insulation layer is formed by first depositing an insulation material on the substrate and then planarizing with a chemical mechanical polish (CMP) step.

15. The method of claim 12 wherein the first dimension is greater than the second dimension and the first axis is the easy-axis of the MTJ element.

16. The method of claim 12 wherein the upper Ta hard mask layer has a thickness less than about 50 Angstroms and the lower NiCr hard mask layer has a thickness less than about 50 Angstroms.

17. A method of fabricating a MTJ element with a top surface having an area determined by a first dimension along a first axis and a second dimension along a second axis, said MTJ element has a stack of layers and is comprised of a seed layer, AFM layer, pinned layer, tunnel barrier, free layer, hard mask spacer layer, and composite hard mask layer with a lower NiCr layer and an upper Ta layer formed in order from bottom to top on a substrate, comprising:

(a) forming the MTJ stack of layers on said substrate;
(b) patterning a first photoresist layer on the composite hard mask layer to form a first parallel line pattern wherein each line has a width that is the first dimension along the first axis;
(c) transferring said first parallel line pattern through the composite hard mask layer, hard mask spacer layer, and at least an upper portion of the free layer with a first etch sequence comprising:
  (1) performing a first fluorocarbon plasma etch step to form a parallel line pattern in the upper hard mask layer;
  (2) removing the first photoresist layer with an oxygen plasma;
  (3) performing a first $CH_3OH$ plasma etch to transfer the parallel line pattern in the upper hard mask layer through the lower hard mask layer and through said upper portion of the free layer to form a parallel line pattern wherein each line has two sidewalls; and
  (4) performing an oxygen plasma to treat exposed surfaces following the first $CH_3OH$ plasma etch;
(d) forming a planar insulation layer adjacent to the two sidewalls of each line and with a thickness that is about equal to said first thickness;
(e) patterning a second photoresist layer on the insulation layer and above the parallel line pattern to form a second parallel line pattern wherein each second photoresist line has a width that is the second dimension along the second axis; and
(f) transferring said second parallel line pattern through the upper Ta layer with a second fluorocarbon plasma etch and then through the lower NiCr layer and at least an upper portion of the free layer with a second $CH_3OH$ plasma etch step to form a post pattern comprised of a plurality of posts wherein each post has an area determined by the first dimension and second dimension.

18. The method of claim 17 further comprised of extending one or both of the first $CH_3OH$ etch step and the second $CH_3OH$ etch step to etch through the entire free layer and stop on the tunnel barrier layer.

19. The method of claim 17 wherein one or both of the first $CH_3OH$ etch step and second $CH_3OH$ etch step stops in the free layer to form an upper section of the free layer having sidewalls while a lower section of the free layer above the tunnel barrier layer and not underlying said upper section is not etched.

20. The method of claim 19 further comprised of oxidizing said lower section of the free layer to form an insulation layer between said MTJ element and adjacent MTJ elements in the plurality of MTJ elements.

21. The method of claim 17 wherein the first dimension is unequal to the second dimension and the MTJ element has an easy-axis that corresponds to one of the first axis or second axis which has a greater dimension, and said MTJ has a hard axis that corresponds to the one of the first axis or second axis that has the smaller dimension.

22. The method of claim 17 wherein the upper Ta hard mask layer has a thickness less than about 500 Angstroms and the lower NiCr hard mask layer has a thickness less than about 50 Angstroms.

* * * * *